US009178509B2

(12) United States Patent
Bernstein

(10) Patent No.: US 9,178,509 B2
(45) Date of Patent: Nov. 3, 2015

(54) ULTRA LOW TRAVEL KEYBOARD

(71) Applicant: Apple Inc., Cupertino, CA (US)

(72) Inventor: Jeffrey T. Bernstein, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 381 days.

(21) Appl. No.: 13/630,867

(22) Filed: Sep. 28, 2012

(65) Prior Publication Data

US 2014/0091857 A1  Apr. 3, 2014

(51) Int. Cl.
*H04B 3/36* (2006.01)
*H03K 17/96* (2006.01)
*H01H 13/14* (2006.01)
*G06F 3/01* (2006.01)
*G06F 3/023* (2006.01)

(52) U.S. Cl.
CPC ............. *H03K 17/962* (2013.01); *G06F 3/016* (2013.01); *G06F 3/023* (2013.01); *H01H 13/14* (2013.01)

(58) Field of Classification Search
CPC ......... G06F 3/016; G06F 3/023; G06F 21/32; G06F 21/83; G06F 3/0202; G06F 3/0238; G06F 3/041; G06F 3/0414; H01H 13/14; H01H 13/48; H01H 13/785; H01H 2201/036; H03K 17/962; H01C 10/106
USPC .................. 340/407.1, 407.2; 341/22, 27, 34; 345/156, 161, 168, 173
See application file for complete search history.

(56) References Cited

U.S. PATENT DOCUMENTS

| 4,412,148 | A |   | 10/1983 | Klicker et al. |
|---|---|---|---|---|
| 5,245,734 | A |   | 9/1993 | Issartel |
| 5,283,408 | A | * | 2/1994 | Chen ............................ 200/345 |
| 5,293,161 | A |   | 3/1994 | MacDonald et al. |
| 5,434,549 | A |   | 7/1995 | Hirabayashi et al. |
| 5,436,622 | A |   | 7/1995 | Gutman et al. |
| 5,510,584 | A | * | 4/1996 | Norris ........................... 200/5 A |
| 5,510,783 | A |   | 4/1996 | Findlater et al. |
| 5,587,875 | A | * | 12/1996 | Sellers ..................... 361/679.13 |
| 5,590,020 | A | * | 12/1996 | Sellers ..................... 361/679.13 |
| 5,602,715 | A | * | 2/1997 | Lempicki et al. ........ 361/679.13 |
| 5,619,005 | A | * | 4/1997 | Shibukawa et al. ............. 84/658 |
| 5,621,610 | A | * | 4/1997 | Moore et al. ............ 361/679.13 |
| 5,625,532 | A | * | 4/1997 | Sellers ..................... 361/679.08 |

(Continued)

FOREIGN PATENT DOCUMENTS

| CN | 101409164 | 4/2009 |
|---|---|---|
| EP | 0483955 | 5/1992 |

(Continued)

OTHER PUBLICATIONS

Nasser et al., "Preliminary Evaluation of a Shape-Memory Alloy Tactile Feedback Display," Advances in Robotics, Mechantronics, and Haptic Interfaces, ASME, DSC—vol. 49, pp. 73-80, 1993.

(Continued)

*Primary Examiner* — Paul Obiniyi
(74) *Attorney, Agent, or Firm* — Brownstein Hyatt Farber Schreck, LLP

(57) ABSTRACT

A keyboard or keyboard key that has a force sensor that measures the force imparted to the key when a user presses the key or rests a finger on a key. Key embodiments may also include an actuator that excites the in order to provide feedback to the user in accordance with various feedback methods disclosed herein.

16 Claims, 13 Drawing Sheets

(56) References Cited

U.S. PATENT DOCUMENTS

| | | | |
|---|---|---|---|
| 5,635,928 A * | 6/1997 | Takagi et al. | 341/22 |
| 5,739,759 A | 4/1998 | Nakazawa et al. | |
| 5,742,242 A * | 4/1998 | Sellers | 341/22 |
| 5,793,605 A * | 8/1998 | Sellers | 361/679.13 |
| 5,812,116 A * | 9/1998 | Malhi | 345/168 |
| 5,818,149 A | 10/1998 | Safari et al. | |
| 5,951,908 A | 9/1999 | Cui et al. | |
| 5,982,304 A * | 11/1999 | Selker et al. | 341/27 |
| 5,982,612 A * | 11/1999 | Roylance | 361/679.14 |
| 5,995,026 A * | 11/1999 | Sellers | 341/34 |
| 5,999,084 A * | 12/1999 | Armstrong | 338/114 |
| 6,135,886 A * | 10/2000 | Armstrong | 463/37 |
| 6,222,525 B1 * | 4/2001 | Armstrong | 345/161 |
| 6,342,880 B2 | 1/2002 | Rosenberg et al. | |
| 6,351,205 B1 * | 2/2002 | Armstrong | 338/114 |
| 6,373,465 B2 | 4/2002 | Jolly et al. | |
| 6,408,187 B1 | 6/2002 | Merriam | |
| 6,411,276 B1 * | 6/2002 | Braun et al. | 345/156 |
| 6,438,393 B1 | 8/2002 | Suuronen | |
| 6,444,928 B2 * | 9/2002 | Okamoto et al. | 200/5 A |
| 6,693,626 B1 * | 2/2004 | Rosenberg | 345/168 |
| 6,717,573 B1 | 4/2004 | Shahoian et al. | |
| 6,809,462 B2 | 10/2004 | Pelrine et al. | |
| 6,864,877 B2 | 3/2005 | Braun et al. | |
| 6,906,697 B2 * | 6/2005 | Rosenberg | 345/156 |
| 6,906,703 B2 | 6/2005 | Vablais et al. | |
| 6,952,203 B2 | 10/2005 | Banerjee et al. | |
| 6,954,657 B2 | 10/2005 | Bork et al. | |
| 6,995,752 B2 | 2/2006 | Lu | |
| 7,121,147 B2 * | 10/2006 | Okada | 73/760 |
| 7,123,948 B2 | 10/2006 | Nielsen | |
| 7,136,045 B2 | 11/2006 | Rosenberg et al. | |
| 7,161,580 B2 | 1/2007 | Bailey et al. | |
| 7,176,906 B2 | 2/2007 | Williams et al. | |
| 7,182,691 B1 | 2/2007 | Schena | |
| 7,219,561 B2 * | 5/2007 | Okada | 73/862.043 |
| 7,253,350 B2 | 8/2007 | Noro et al. | |
| 7,333,604 B2 | 2/2008 | Zernovizky et al. | |
| 7,348,968 B2 | 3/2008 | Dawson | |
| 7,392,066 B2 | 6/2008 | Haparnas | |
| 7,423,631 B2 | 9/2008 | Shahoian et al. | |
| 7,446,752 B2 | 11/2008 | Goldenberg et al. | |
| 7,508,382 B2 | 3/2009 | Denoue et al. | |
| 7,561,142 B2 | 7/2009 | Shahoian et al. | |
| 7,569,086 B2 | 8/2009 | Chandran | |
| 7,675,414 B2 | 3/2010 | Ray | |
| 7,679,611 B2 | 3/2010 | Schena | |
| 7,710,399 B2 | 5/2010 | Bruneau et al. | |
| 7,798,982 B2 | 9/2010 | Zets et al. | |
| 7,952,261 B2 | 5/2011 | Lipton et al. | |
| 7,952,566 B2 | 5/2011 | Poupyrev et al. | |
| 7,956,770 B2 | 6/2011 | Klinghult et al. | |
| 7,961,909 B2 | 6/2011 | Mandella et al. | |
| 8,044,940 B2 | 10/2011 | Narusawa | |
| 8,077,145 B2 | 12/2011 | Rosenberg et al. | |
| 8,081,156 B2 | 12/2011 | Ruettiger | |
| 8,125,453 B2 | 2/2012 | Shahoian et al. | |
| 8,174,372 B2 | 5/2012 | da Costa | |
| 8,179,202 B2 | 5/2012 | Cruz-Hernandez et al. | |
| 8,232,494 B2 | 7/2012 | Purcocks | |
| 8,253,686 B2 | 8/2012 | Kyung et al. | |
| 8,344,834 B2 | 1/2013 | Niiyama | |
| 8,378,797 B2 | 2/2013 | Pance et al. | |
| 8,378,965 B2 | 2/2013 | Gregorio et al. | |
| 8,398,570 B2 | 3/2013 | Mortimer et al. | |
| 8,487,759 B2 | 7/2013 | Hill | |
| 8,547,341 B2 | 10/2013 | Takashima et al. | |
| 8,633,916 B2 | 1/2014 | Bernstein et al. | |
| 8,710,966 B2 * | 4/2014 | Hill | 340/407.1 |
| 8,866,600 B2 * | 10/2014 | Yang et al. | 340/407.1 |
| 2004/0021663 A1 | 2/2004 | Suzuki et al. | |
| 2004/0127198 A1 | 7/2004 | Roskind et al. | |
| 2005/0057528 A1 | 3/2005 | Kleen | |
| 2005/0107129 A1 | 5/2005 | Kaewell et al. | |
| 2005/0110778 A1 | 5/2005 | Ben Ayed | |
| 2005/0118922 A1 | 6/2005 | Endo | |
| 2005/0217983 A1 * | 10/2005 | Hsu | 200/5 A |
| 2005/0248549 A1 | 11/2005 | Dietz et al. | |
| 2006/0046319 A1 * | 3/2006 | Takeda | 438/3 |
| 2006/0154674 A1 | 7/2006 | Landschaft et al. | |
| 2006/0209037 A1 | 9/2006 | Wang et al. | |
| 2006/0239746 A1 * | 10/2006 | Grant | 400/490 |
| 2006/0252463 A1 | 11/2006 | Liao et al. | |
| 2007/0099574 A1 | 5/2007 | Wang | |
| 2007/0152974 A1 | 7/2007 | Kim et al. | |
| 2007/0188450 A1 | 8/2007 | Hernandez et al. | |
| 2008/0084384 A1 | 4/2008 | Gregorio et al. | |
| 2008/0158149 A1 | 7/2008 | Levin | |
| 2008/0165148 A1 | 7/2008 | Williamson et al. | |
| 2008/0181706 A1 | 7/2008 | Jackson | |
| 2008/0192014 A1 | 8/2008 | Kent et al. | |
| 2008/0223926 A1 * | 9/2008 | Miller et al. | 235/382 |
| 2008/0255794 A1 * | 10/2008 | Levine | 702/141 |
| 2008/0291620 A1 | 11/2008 | DiFonzo et al. | |
| 2009/0115734 A1 | 5/2009 | Fredriksson et al. | |
| 2009/0128503 A1 | 5/2009 | Grant et al. | |
| 2009/0135142 A1 | 5/2009 | Fu et al. | |
| 2009/0167542 A1 | 7/2009 | Culbert et al. | |
| 2009/0167702 A1 | 7/2009 | Nurmi | |
| 2009/0167704 A1 | 7/2009 | Terlizzi et al. | |
| 2009/0218148 A1 | 9/2009 | Hugeback et al. | |
| 2009/0225046 A1 | 9/2009 | Kim et al. | |
| 2009/0267892 A1 | 10/2009 | Faubert | |
| 2009/0267920 A1 | 10/2009 | Faubert et al. | |
| 2009/0313542 A1 | 12/2009 | Cruz-Hernandez et al. | |
| 2010/0048256 A1 | 2/2010 | Huppi et al. | |
| 2010/0053087 A1 | 3/2010 | Dai et al. | |
| 2010/0194547 A1 | 8/2010 | Terrell et al. | |
| 2010/0231508 A1 * | 9/2010 | Cruz-Hernandez et al. | 345/156 |
| 2010/0231550 A1 | 9/2010 | Cruz-Hernandez et al. | |
| 2010/0328229 A1 | 12/2010 | Weber et al. | |
| 2011/0077055 A1 | 3/2011 | Pakula et al. | |
| 2011/0107958 A1 | 5/2011 | Pance et al. | |
| 2011/0121765 A1 * | 5/2011 | Anderson et al. | 318/116 |
| 2011/0128239 A1 | 6/2011 | Polyakov et al. | |
| 2011/0203912 A1 | 8/2011 | Niu | |
| 2011/0291950 A1 | 12/2011 | Tong | |
| 2012/0068957 A1 | 3/2012 | Puskarich et al. | |
| 2012/0075198 A1 * | 3/2012 | Sulem et al. | 345/173 |
| 2012/0127088 A1 | 5/2012 | Pance et al. | |
| 2012/0193211 A1 * | 8/2012 | Ciesla et al. | 200/81 H |
| 2012/0268412 A1 | 10/2012 | Cruz-Hernandez et al. | |
| 2012/0327006 A1 | 12/2012 | Israr et al. | |
| 2013/0120290 A1 | 5/2013 | Yumiki et al. | |
| 2013/0181913 A1 | 7/2013 | Cole et al. | |
| 2013/0300549 A1 | 11/2013 | Hill | |
| 2014/0267952 A1 | 9/2014 | Sirois | |
| 2015/0109215 A1 | 4/2015 | Puskarich | |

FOREIGN PATENT DOCUMENTS

| | | | |
|---|---|---|---|
| EP | 1047258 | 10/2000 | |
| EP | 1686776 | 8/2006 | |
| EP | 2073099 | 6/2009 | |
| EP | 2194444 A2 * | 6/2010 | G06F 3/01 |
| EP | 2395414 A1 * | 12/2011 | |
| EP | 2631746 A1 * | 8/2013 | |
| JP | 2004236202 | 8/2004 | |
| KR | 20050033909 | 4/2005 | |
| TW | 200518000 | 11/2007 | |
| WO | WO 97/16932 | 5/1997 | |
| WO | WO 02/073587 | 9/2002 | |
| WO | WO 03/038800 | 5/2003 | |
| WO | WO 2006/057770 | 6/2006 | |
| WO | WO 2007/114631 | 10/2007 | |
| WO | WO 2008/075082 | 6/2008 | |
| WO | WO 2009/038862 | 3/2009 | |
| WO | WO 2009/068986 | 6/2009 | |
| WO | WO 2009/097866 | 8/2009 | |

(56) References Cited

FOREIGN PATENT DOCUMENTS

| WO | WO 2009/122331 | 10/2009 |
|---|---|---|
| WO | WO 2009/150287 | 12/2009 |
| WO | WO 2010/087925 | 8/2010 |

OTHER PUBLICATIONS

Hill et al., "Real-time Estimation of Human Impedance for Haptic Interfaces," Stanford Telerobotics Laboratory, Department of Mechanical Engineering, Standford University, 6 pages, at least as early as Sep. 30, 2009.

Lee et al, "Haptic Pen: Tactile Feedback Stylus for Touch Screens," Mitsubishi Electric Research Laboratories, http://wwwlmerl.com, 6 pages, Oct. 2004.
U.S. Appl. No. 14/493,190, filed Sep. 22, 2014, Hoen.
U.S. Appl. No. 14/512,927, filed Oct. 13, 2014, Hill.
Invitation to Pay Additional Fees dated Nov. 26, 2013, PCT/US2013/055599, 5 pages.
International Search Report dated Feb. 12, 2014, PCT/US2013/055599, 7 pages.
U.S. Appl. No. 12/887,455, filed Sep. 21, 2010, Puskarich et al.
U.S. Appl. No. 12/950,940, filed Nov. 19, 2010, Pance et al.
U.S. Appl. No. 13/943,639, filed Jul. 16, 2013, Hill.
U.S. Appl. No. 14/059,693, filed Oct. 22, 2013, Puskarich.
U.S. Appl. No. 14/165,475, filed Jan. 27, 2014, Hayskjold et al.

\* cited by examiner

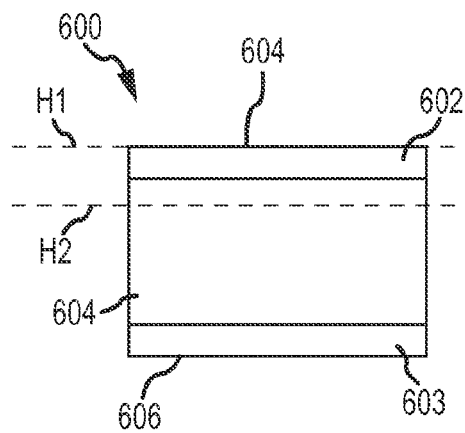
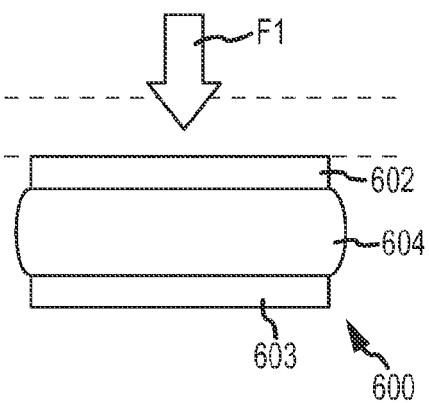
FIG.6A  FIG.6B
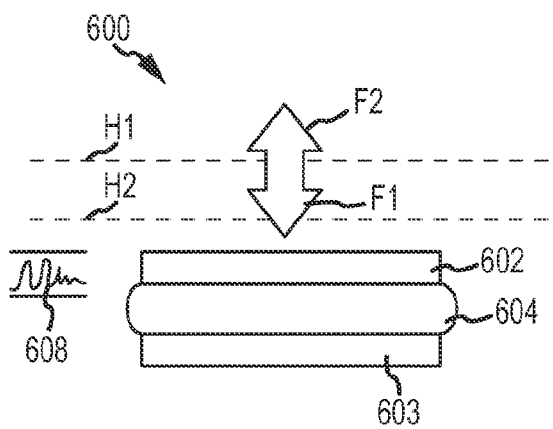
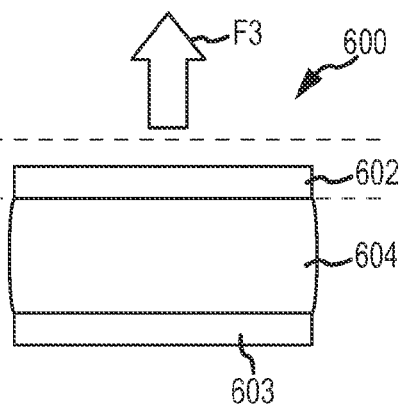
FIG.6C  FIG.6D

ULTRA LOW TRAVEL KEYBOARD

TECHNICAL FIELD

The present disclosure relates generally to a keyboard or keyboard key for an electronic device such as a laptop or desktop computer.

BACKGROUND

Electronic devices, such as laptops and desktop computers, may be equipped with a keyboard that provides a mechanism for entering user input. For example, a user strikes a key on the keyboard and, in response, the keyboard sends a signal to the larger system to which the keyboard is attached. Conventional keyboards typically include mechanical switches or other types of contacts that close when the key is pressed. When a key of a conventional keyboard is pressed, the key travels a substantial distance in order to close the switch or otherwise make a contact that registers a key press. Additionally, a key of a conventional keyboard typically is limited to one response that occurs when the switch or other contact is closed.

Because a conventional keyboard key typically travels a substantial distance, the space required to accommodate this travel may prevent thinner keyboards from being manufactured with conventional technology. Accordingly, in one respect, it may be desirable to have a keyboard key that does not travel a substantial distance so as to be able to produce thinner keyboards. In another respect, it may be desirable to have a keyboard key that can accommodate more than one response in a single key. These and other considerations are addressed by the following disclosure.

SUMMARY

In various embodiments, the present disclosure relates to a key for a computing device keyboard, comprising: a key cap; a force sensor contained within the key cap, the force sensor configured to measure an amount of force imparted to a surface of the key cap; and an output line configured to carry a signal that indicates an amount of force imparted to the key cap through a force signal that varies based on the force measured by the force sensor.

In some embodiments, the force sensor is a resistive force sensor that responds to the force imparted to the surface of the key cap with a change in conductivity that is used to modulated the force signal.

In some embodiments, the force sensor is a stain gauge that changes a resistance by deforming in response to the force imparted to the surface of the key cap, the change in resistance being used to modulate the force signal.

In some embodiments, the force sensor is a capacitive force sensor that includes a compressible dielectric that changes the capacitance of the capacitive force sensor by deforming in response to the force imparted to the surface of the key cap, the change in capacitance being used to modulate the force signal.

In some embodiments, the key further comprises an input line configured to receive an excitation signal responsive to the force signal, and an actuator contained within the key cap, the actuator configured to excite the key cap in response to the excitation signal such that an opposing force is imparted to the key cap responsive to the force that is imparted to the surface of the key cap.

In some embodiments, the actuator is a peizioelectric material that excites the key cap by deforming under a mechanical strain that is induced in the peizioelectric material in response to the excitation signal.

In various embodiments, the present disclosure relates to a key for a computing device keyboard, comprising: a key cap; a first conductive plate connected to an interior surface of the key cap; a second conductive plate configured to connect to a fixed point on a keyboard such that when a force is imparted to an exterior surface of the key cap, the first conductive plate moves closer to the second conductive plate; an electro-active polymer connected between the first and second conductive plates such that when the first conductive plate moves closer to the second conductive plate, the capacitance of the electro-active polymer changes; and an output configured to indicate an amount of force imparted to the key through a force signal that varies based on the distance between the first conductive plate and the second conductive plate.

In some embodiments, the key further comprises an input configured to receive an excitation signal responsive to the force signal, wherein the excitation signal excites the electro-active polymer such that an opposing force is imparted to the key cap responsive to the force that is imparted to the exterior surface of the key cap.

In various embodiments, the present disclosure relates to a method of controlling a keyboard, comprising receiving an input signal at a computing device from a keyboard, the input signal indicating an amount of force imparted to a key on the keyboard; determining, by the computing device, if the key was pressed by determining if the amount of force imparted to the key was greater than a threshold amount; and executing, by the computing device, a function that is associated with the key if the amount of force imparted to the key was greater than the threshold amount.

Some embodiments further comprises providing feedback to the key press by transmitting an excitation signal from the computing device to the keyboard that causes a tangible excitation in the key.

In some embodiments, the tangible excitation is of a first type that includes an initial excitation of a first magnitude that occurs for a predetermined duration after the key press occurs, and after the predetermined duration elapses no further excitations of the first magnitude occur while the force imparted to the key remains greater than the threshold amount, the method further comprising determining, by the computing device, that a finger is resting on the key if the amount of force imparted to the key is not greater than the threshold amount; providing feedback to the finger resting on the key by transmitting an excitation signal from the computing device to the keyboard that causes a tangible excitation of a second type in the key, the tangible excitation of the second type including a vibration that occurs so long as the force is imparted to the key and so long as the force imparted to the key does not exceed the threshold amount.

Some embodiments further comprises a key type for the key; and fetching a data value for the threshold amount used to determine if the key was pressed from a data structure that defines a plurality threshold amounts for various key types.

In some embodiments, the threshold amount is a first threshold amount, and the function associated with the key is a first function, the method further comprising determining, by the computing device, if the key was deeply pressed by determining if the amount of force imparted to the key is greater than a second threshold amount that is greater than the first threshold amount; and executing, by the computing device, a second function associated with the key that is different from the first function if the amount of force imparted to the key was greater than the second threshold amount.

Some embodiments further comprises if the key was pressed, providing feedback to the key press by transmitting an excitation signal from the computing device to the keyboard that causes a tangible excitation of a first magnitude in the key; and if the key was deeply pressed, providing feedback to the deep key press by transmitting an excitation signal from the computing device to the keyboard that causes a tangible excitation of a second magnitude in the key, wherein the first magnitude is greater than the second magnitude.

In some embodiments, the input signal is a first input signal and the key is a first key, the method comprising receiving a second input signal at the computing device from the keyboard, the second input signal indicating an amount of force imparted to a second key on the keyboard; determining, by the computing device, if both the first key and the second key were pressed by determining if the amount of force imparted to both the first key and the second key is greater than a threshold amount; and executing, by the computing device, a command that is associated with the combination of the first key and the second key if the amount of force imparted to both the first key and the second key is greater than a threshold amount.

Some embodiments further comprises: providing feedback to both the first key press and the second key press by transmitting an excitation signal from the computing device to the keyboard that causes a tangible excitation in both the first key and the second key; and In some embodiments, the input signal is a first input signal and the key is a first key, the method comprising receiving a second input signal at the computing device from the keyboard, the second input signal indicating an amount of force imparted to a second key on the keyboard; determining, by the computing device, that a finger is resting on the first key if the amount of force imparted to the first key is not greater than the threshold amount; determining, by the computing device, that a finger is resting on the second key if the amount of force imparted to the second key is not greater than the threshold amount; displaying a result of the command but not executing the command while a finger is resting on both the first key and the second key.

In various embodiments, the present disclosure relates to a method of controlling a keyboard, comprising receiving an input signal at a computing device from a keyboard, the input signal indicating an amount of force imparted to a plurality of keys on the keyboard; determining, by the computing device, if the keyboard was mashed by determining if the amount of force imparted to the plurality of keys is greater than a threshold amount for a number of keys that exceeds a number of keys used to input a command through the keyboard; if the keyboard was not mashed, executing a command indicated by the input signal; and if the keyboard was mashed, not executing a command responsive to the input signal.

Some embodiments further comprises if the keyboard was mashed, determining if the keyboard is awake; and waking the keyboard if the keyboard is not awake and the keyboard was mashed.

In various embodiments, the present disclosure relates to a method of controlling a keyboard, comprising receiving an input signal at a computing device from a keyboard, the input signal indicating an amount of force imparted to a key on the keyboard; in response to the receiving the input signal, executing, by the computing device, a function proportionally based on the amount of force that is imparted to the key, wherein the function is associated with the key.

Some embodiments further comprises providing feedback by transmitting an excitation signal from the computing device to the keyboard that causes a tangible excitation in the key that is proportional to the force that is imparted to the key.

In various embodiments, the present disclosure relates to a method of controlling a keyboard, comprising receiving an input signal at a computing device from a keyboard, the input signal indicating an amount of force imparted to a key on the keyboard; determining, by the computing device, a velocity with which the key was pressed based on the force imparted to the key; and executing, by the computing device, a function proportionally based on the velocity with which the key was pressed, wherein the function is associated with the key.

Some embodiments further comprises providing feedback by transmitting an excitation signal from the computing device to the keyboard that causes a tangible excitation in the key that is proportional to the velocity with which the key was pressed.

BRIEF DESCRIPTION OF THE DRAWINGS

FIGS. 6A-6D are schematic illustrations of a combined force sensor and actuator in accordance with embodiments discussed herein;

SPECIFICATION

This disclosure generally relates to a keyboard having a number of keys that are operable to measure a force with which the key is pressed. More specifically, when a user presses a key or rests a finger on a key, the force imparted to the key from the finger is measured or otherwise registered by a force sensor associated with the key. The key may output a signal that varies with the force imparted to the key so that the larger system to which the keyboard is connected may register a keyboard input. Once the system receives the keyboard input, the system may interpret the input and execute a command or function associated with the key.

By measuring keyboard input with force sensors, embodiments discussed herein may provide an ultra-low travel keyboard. Specifically, the keys are not required to move a substantial distance when a user presses the keys. In contrast, when a key of a conventional keyboard is pressed, the key travels a substantial distance in order to close a switch or otherwise make a contact that registers a key press. Because many force sensors can sense relatively small changes in a distance through changes in force, present embodiments allow for thinner keyboards in comparison to conventional keyboards. Additionally, by providing force sensors to measure keyboard input, present embodiments may expand the functionality of the keyboard. More specifically, different functions or commands may be associated with different levels of force input received at the key.

In addition to a force sensor, present embodiments may also include an actuator associated with a keyboard key. The actuator may be configured to excite the key in response to an excitation signal received from the larger computer system to which the keyboard is attached. The system may excite the key in order to provide a feedback to the user when the user presses or otherwise contacts the key. In one respect, the feedback may provide the user with a tangible or tactile sensation that mimics or otherwise replaces the "click" that typically accompanies a key press in a conventional keyboard.

Figure 1:
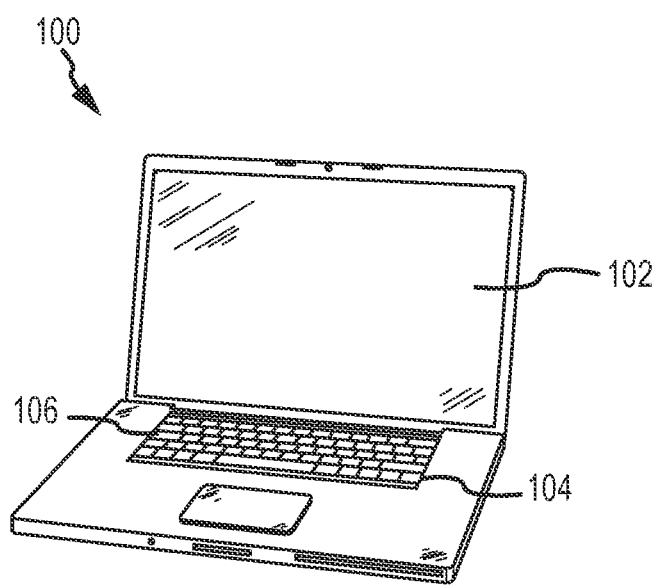
FIG. 1 is a schematic illustration of an electronic device that incorporates an ultra-low travel keyboard in accordance with embodiments discussed herein.

FIG. 1 is a schematic illustration of an electronic device 100 that incorporates an ultra-low travel keyboard 104 in accordance with embodiments discussed herein. By way of example, the ultra-low travel keyboard 104 shown in FIG. 1 is a component of a laptop computer. The laptop computer may process input received from the ultra-low travel keyboard 104 and, in response, execute commands or functions associated with the keyboard input. In some instances, processing keyboard input may include providing output to a display device 102.

It should be appreciated that FIG. 1 shows an ultralow travel keyboard 104 as a component of a laptop computer by way of example and not limitation. Generally, an ultra-low travel keyboard in accordance with embodiments discussed herein may used in connection with any wired or wireless system that calls for a keyboard or to which a keyboard may be attached. More specifically, keyboard embodiments may be used with any portable or non-portable device including but not limited to a communication device (e.g. mobile phone, smart phone), a multi-media device (e.g., MP3 player, TV, radio), a portable or handheld computer (e.g., tablet, netbook, laptop), a desktop computer, an All-In-One desktop, a peripheral device. and so.

Figure 2:
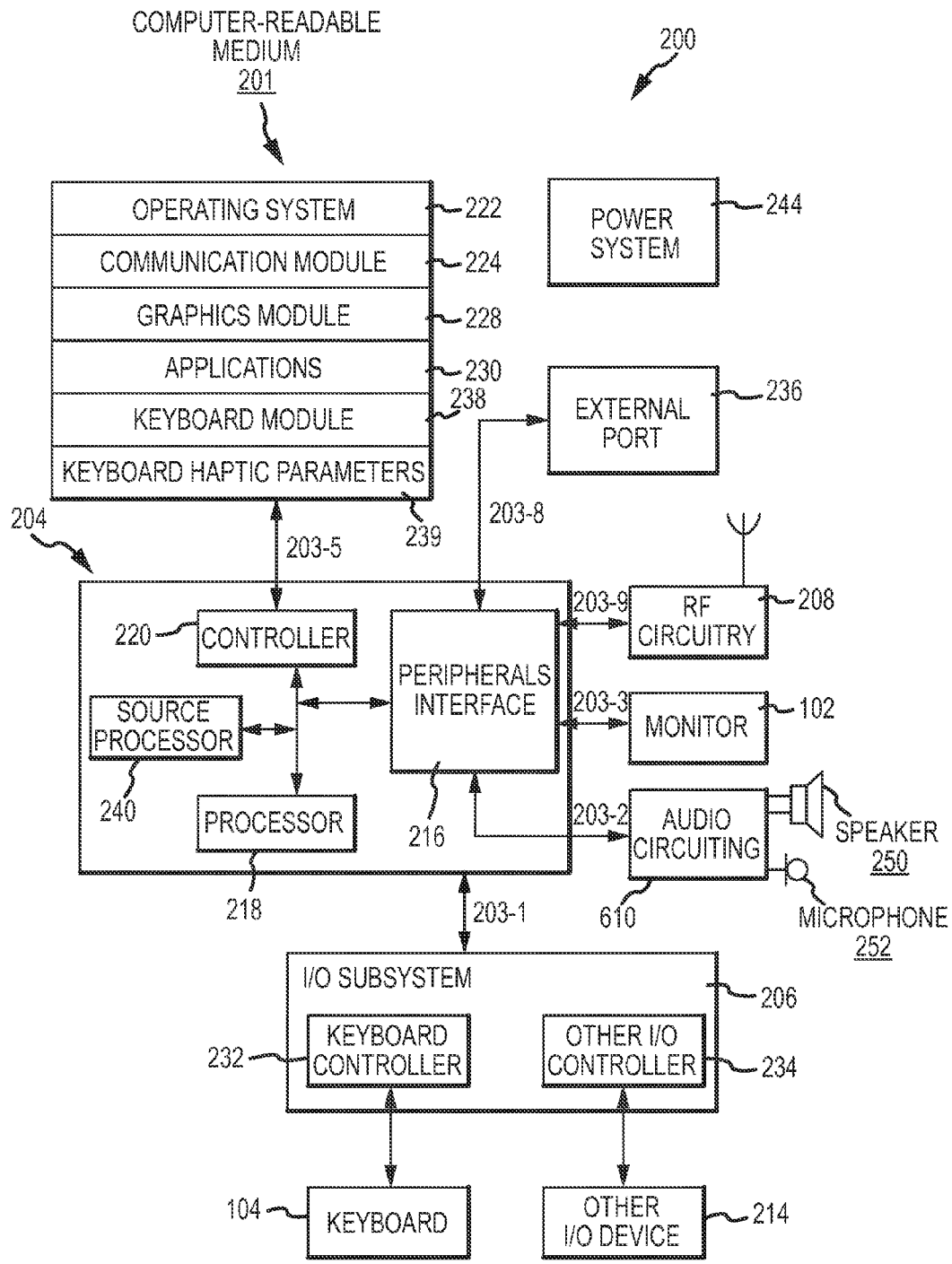
FIG. 2 attention is a schematic illustration of system architecture that incorporates an ultra-low travel keyboard with embodiments discussed herein.

Referring to FIG. 2, attention is now directed towards embodiments of a system architecture 200 that incorporates an ultra-low travel keyboard. The system architecture 200 may represent the laptop computer shown in FIG. 1 or any other system or device adaptable to the inclusion of system architecture 200. FIG. 2 is a block diagram of one embodiment of system 200 that generally includes one or more computer-readable mediums 201, processing system 204, input/output (I/O) subsystem 206, radio frequency (RF) circuitry 208 and audio circuitry 210. The system may also include one or more communication buses or signal lines 203 that couple the various system components. Each such bus or signal line may be denoted in the form 203-X, where X is a unique number. The bus or signal line may carry data of the appropriate type between components; each bus or signal line may differ from other buses/lines, but may perform generally similar operations.

It should be apparent that the architecture shown in FIG. 2 is only one example architecture of system 200, and that system 200 could have more or fewer components than shown, or a different configuration of components. The various components shown in FIG. 2 can be implemented in hardware, software, firmware or any combination thereof, including one or more signal processing and/or application specific integrated circuits.

RF circuitry 208 is used to send and receive information over a wireless link or network to one or more other devices and includes well-known circuitry for performing this function. RF circuitry 208 and audio circuitry 210 are coupled to processing system 204 via peripherals interface 216. Interface 216 includes various known components for establishing and maintaining communication between peripherals and processing system 204. Audio circuitry 210 is coupled to audio speaker 250 and microphone 252 and includes known circuitry for processing voice signals received from interface 216 to enable a user to communicate in real-time with other users. In some embodiments, audio circuitry 210 includes a headphone jack (not shown).

Peripherals interface 216 couples the input and output peripherals of the system to processor 218 and computer-readable medium 201. FIG. 2 shows the processor 218 as a single element by way of illustration. It should be appreciated that the processor 218 may include a single processor, a group of processors and/or processing units, as appropriate for a given implementation. Thus, One or more processors 218 or groups of processor units communicate with one or more computer-readable mediums 201 via controller 220. Computer-readable medium 201 can be any device or medium that can store code and/or data for use by one or more processors 218. Medium 201 can include a memory hierarchy, including but not limited to cache, main memory and secondary memory. The memory hierarchy can be implemented using any combination of RAM (e.g., SRAM, DRAM, DDRAM), ROM, FLASH, magnetic and/or optical storage devices, such as disk drives, magnetic tape, CDs (compact disks) and DVDs (digital video discs). Medium 201 may also include a transmission medium for carrying information-bearing signals indicative of computer instructions or data (with or without a carrier wave upon which the signals are modulated). For example, the transmission medium may include a communications network, including but not limited to the Internet (also referred to as the World Wide Web), intranet(s), Local Area Networks (LANs), Wide Local Area Networks (WLANs), Storage Area Networks (SANs), Metropolitan Area Networks (MAN) and the like.

I/O subsystem 206 is coupled to the keyboard 104 and one or more other I/O devices 214 for controlling or performing various functions. The keyboard 104 communicates with the processing system 204 via the keyboard controller 2032, which includes various components for processing keyboard input. One or more other input controllers 234 receives/sends electrical signals from/to other I/O devices 214. Other I/O devices 214 may include physical buttons, dials, slider switches, sticks, keyboards, touch pads, additional display screens, or any combination thereof.

One or more processors 218 run various software components stored in medium 201 to perform various functions for system 200. In some embodiments, the software components include an operating system 222 that includes various procedures, sets of instructions, software components and/or drivers for controlling and managing general system tasks (e.g., memory management, storage device control, power management, etc.) and for facilitating communication between various hardware and software components. The software components may also include a communication module (or set of instructions) 224 that facilitates communication with other devices over one or more external ports 236 or via RF circuitry 208 and includes various software components for handling data received from RF circuitry 208 and/or external port 236. In some embodiments, the software components include a graphics module (or set of instructions) 228 that includes various known software components for rendering, animating and displaying graphical objects on a display surface. The software components may also include one or more applications (or set of instructions) 230 that can include any applications installed on system 200, including without limitation, a browser, address book, contact list, email, instant messaging, word processing, keyboard emulation, widgets, JAVA-enabled applications, encryption, digital rights management, voice recognition, voice replication, location determination capability (such as that provided by the global positioning system (GPS)), a music player, etc.

The software components stored in medium 201 may also include a keyboard module (or set of instructions) 238. Keyboard module 238 includes various software components for performing various tasks associated with including but not limited to receiving and processing keyboard input received from the keyboard 104 via a keyboard controller 632. The keyboard module 238 may process keyboard inputs such as is described herein in connection with FIGS. 7-14. Here, the keyboard module 238 may capture force measurements and/or transmit the same to the processor 218 and/or secure processor 240. The keyboard module 638 may also control certain operational aspects of the keyboard 104, such as exciting one or more keys to provide feedback to keyboard input.

The keyboard module 238 may be provided in association with a number of keyboard haptic parameters 239. The keyboard haptic parameters 239 may be provided in a table or other data structure stored on the computer readable medium 201.

Module 238 may also interact with the graphics module 228 or other graphical display to provide outputs in response to keyboard input. Module 238 may be embodied as hardware, software, firmware, or any combination thereof. Although module 238 is shown to reside within medium 201, all or portions of module 238 may be embodied within other components within system 200 or may be wholly embodied as a separate component within system 200.

Each of these modules and above noted applications correspond to a set of instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise rearranged in various embodiments. In some embodiments, medium 201 may store a subset of the modules and data structures identified above. Furthermore, medium 201 may store additional modules and data structures not described above.

System 200 also includes power system 244 for powering the various hardware components and may include a power management system, one or more power sources, a recharging system, a power failure detection circuit, a power converter or inverter, a power status indicator and any other components typically associated with the generation, management and distribution of power in portable devices.

In some embodiments, peripherals interface 216, one or more processors 218, and memory controller 220 may be implemented on a single chip, such as processing system 204. In some other embodiments, they may be implemented on separate chips.

In addition to the foregoing, the system 200 may include a secure processor 240 in communication with the keyboard 104, via the keyboard controller 232. The operation of these various elements, as well as the structure of various keyboard components will now be described.

Figure 3:
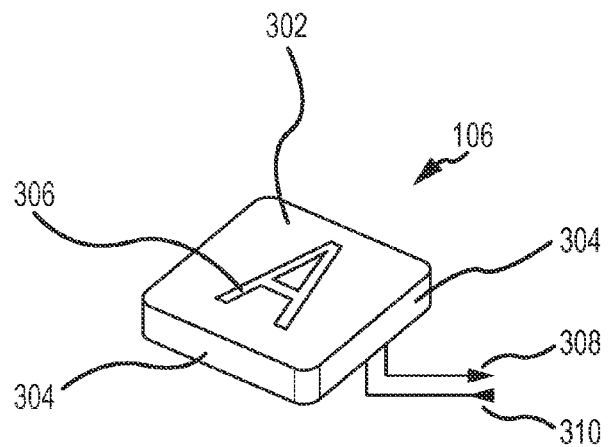
FIG. 3 is a perspective illustration of an individual key of the keyboard shown in FIG. 1.

FIG. 3 is a perspective illustration of an individual key 106 of the keyboard 104. As can be seen in FIG. 3, the key 106 includes a top surface 302 connected to a plurality of sidewalls 304. The top surface 302 may provide an engagement surface for a finger, stylus, or other object that presses or rests against the key 106. The top surface 302 may also include a key label 306 that identifies a character, function, or command associated with the key. The key 106 may also include an output line 308 and an input line 310. The output line 308 and the input line 310 may extend from an underside 312 of the key 106 and connect from there to the keyboard 104 or to the larger system 200 to which the keyboard 104 is connected. The output line 308 and/or input line 310 may be physical or may be virtual, representing particular functionality of the key. Thus, for example, these lines may indicate busses or data transmitted across certain interconnections.

The output line 308 may carry a force signal that indicates an amount of force that is applied to the top surface 302 of the key 106. The force signal carried by the output line 308 may be a continuously varying signal such that the instantaneous value of the force signal represents an amount of force that is substantially currently being applied to the top surface 302 of the key 106. The force signal may be received as input by the keyboard controller 232 and from there transmitted to the keyboard module 238 for processing.

The input line 310 may carry an excitation signal that is transmitted to the key 106 from the keyboard controller 232 or other processor or controller that is associated with the larger system to which the keyboard 104 is attached. The excitation signal carried on the input 310 may cause the key 106 to be excited such that feedback is provided in response to a key press or other contact with the top surface 302 of the key 106. The excitation signal may be output from the keyboard controller 232 (or other suitable processing element) in response to a processing of the force signal by the keyboard module 232. In one embodiment, the keyboard module 238 may cause the keyboard controller 232 to excite the key 106 in response to a determination that the force applied to the key 106 exceeds a predetermined threshold amount.

As can be seen in FIG. 3, the key 106 is labeled with an "A." The "A" label 306 identifies the key 106 as being a character key, or more specifically a letter key. Thus, when a user actuates the key 106 by pressing down on the top surface of the key 106, the system may respond by entering the letter "A" at an appropriate point in a document or other application such as at the cursor. In addition to letter keys, the keyboard 104 may also include other character keys such as numbers keys.

In addition to character keys, the keyboard 104 may include command keys such as "caps lock," "shift," "return," "delete," and so on. In one respect, command keys may allow more than one character to be associated with a character key 106. By way of example, the key 106 shown in FIG. 3 may be associated with both an uppercase "A" and a lowercase "a" even though the key 106 is labeled only with the uppercase "A." As can be appreciated, the system will interpret a key press of the key 106 as being either an uppercase "A" or a lowercase "A" depending on the context or other keyboard inputs. For example, if "caps lock" is enabled or the shift button is depressed, the system may interpret a key press of the key 106 as an upper case "A." Similarly, if the caps lock button is not enabled or the shift button is not depressed, the system may interpret a key press of the key 106 as a lowercase "a." In other respects, command keys may be used to execute commands that are not necessarily associated with characters. For example, pressing a particular command key or combination of command keys may cause the system to execute a certain functions such as changing the current application and so on.

Figure 4:
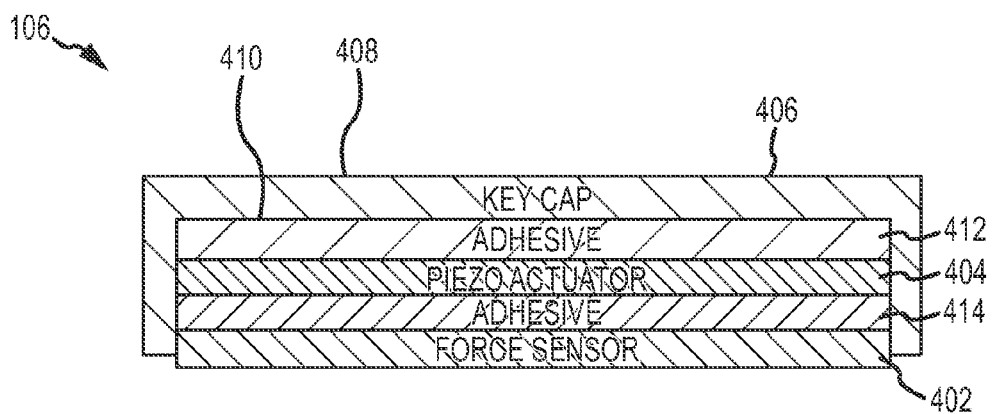
FIG. 4 is a cross-sectional side elevation view of a key embodiment.

FIG. 4 is a cross-sectional side elevation view of a key 106 embodiment. As shown in FIG. 4, the key 106 may include a force sensor 402 that may be operably connected to the output 302. The force sensor 402 may measure a force that is applied to the top surface 302 of the key 106 and, in response, generate the force signal that is carried on the output line 308. Additionally, the key 106 may include an actuator 404 that may be operably connected to the input line 310. The actuator 404 may excite the key 106 in response to the excitation signal carried on the input line 310. As shown in FIG. 4, the force sensor 402 and the actuator 404 may be attached to or otherwise contained within the interior of a key cap 406.

The key cap 406 may be formed of a plastic, ceramic, or durable material that encloses and protects the force sensor 402 and the actuator 404. The key cap 406 forms the exterior of the key 106 and as such includes the top surface 302 and the sidewalls 304 shown in FIG. 3. As can be seen in FIG. 4, the top surface 302 of the key cap 406 includes an external side 406 and an internal side 408 opposite from the external side 406. The external side 406 may contain the label 306 and provide the engagement surface for a finger, stylus, or other object as described above. The internal side 408 of the top surface 302 may provide a connection surface to which components that are internal to the key 106 may attach. As shown in FIG. 4, the actuator 404 may attach to the internal side 408 of the top surface 302 through a first adhesive layer 410. The force sensor 402 may be disposed under the actuator 404 and connected thereto through a second adhesive layer 412.

In one embodiment, the actuator 404 is implemented with a piezoelectric material that generates an electrical charge resulting from an applied mechanical force and that generates a mechanical strain resulting from an applied electrical field. The actuator 404 may be implemented with any crystal, ceramic or other type of material that exhibits piezoelectric properties. In one embodiment, the actuator 404 is implemented with a material that includes lead zirconate titanate crystals.

Figure 5A:
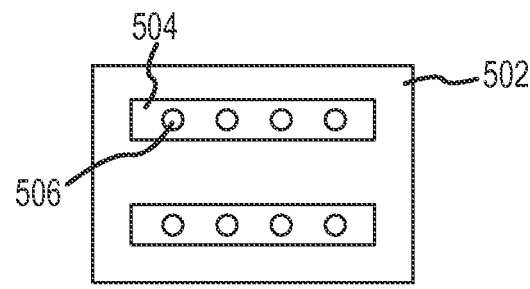
FIG. 5A is an illustration of a resistive force sensor embodiment that may be used to implement the force sensor shown in FIG. 4.

FIG. 5A is a top plan view of a resistive force sensor 502 embodiment that may be used to implement the force sensor 402 shown in FIG. 4. The restive force sensor 502 may include one or more attachment strips 504. The attachment strips 504 may each include a number of conductive regions 506. In one embodiment, the conductive regions 506 are circular, such as shown in FIG. 5A. It should be appreciated that, in accordance with other embodiments, the conductive regions 506 may take on any appropriate shape. The conductive regions 506 are configured to contact the adhesive 412 or other key 106 component or structure that is disposed above the force sensor 402 when the key 106 is assembled. When a force is applied to the top surface 302 of the key 106, the internal components of the key 106 compress against the conductive regions 506 such that their conductivity changes in proportion to the amount of force applied. This change in conductivity then modulates a voltage that is output from the key 106 on the output line 308. In accordance with an alternative embodiment, the force resistive force sensor may be used that has a two-layer construction with the bottom of the top layer, and top of the bottom layer, having a wave shape. As the sensor is compressed, the top and bottom layers are pressed together, deforming the wave shape and putting more and more of the top and bottom layers in contact with one another. In the compressed configuration, the force sensor yields less resistance and so the force can be measured as a function of the change in resistance.

Figure 5B:
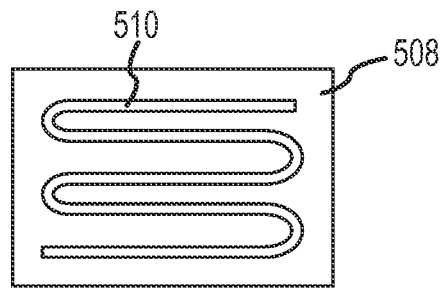
FIG. 5B is an illustration of a strain gauge force sensor embodiment that may be used to implement the force sensor shown in FIG. 4.

FIG. 5B is a plan illustration of a strain gauge force sensor 508 embodiment that may be used to implement the force sensor 402 shown in FIG. 4. As shown in FIG. 4, the strain gauge force sensor 508 may include a backing that supports a metallic foil pattern 510. The metallic foil pattern 510 is deformed when the key 106 is compressed. This deformation of the foil 510 causes the electrical resistance of the foil to change. This change in electrical resistance then modulates a voltage that is output from the key 106 on the output line 308.

Figure 5C:
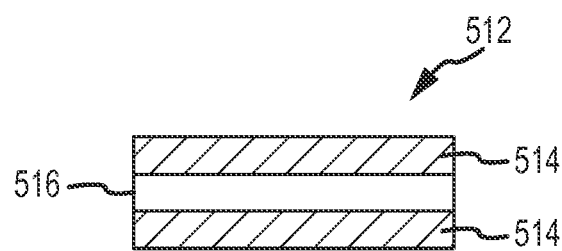
FIG. 5C is an illustration of a capacitive force sensor embodiment that may be used to implement the force sensor shown in FIG. 4.

FIG. 5C is an illustration of a cross-sectional side view of a capacitive force sensor 512 embodiment that may be used to implement the force sensor 402 shown in FIG. 4. As shown in FIG. 4, the capacitive force sensor 512 may include a compressible dielectric material 516 disposed between two conductive plates 514. When the dielectric material 516 compresses in response to a deformation of the key 106, the capacitance of the force sensor 512 changes. This change in capacitance then modulates a voltage that is output from the key 106 on the output line 308. In accordance with another embodiment, the plates of the capacitive force sensor 512 are distributed, so that one plate is disposed at the bottom of the key cap 406 and other plate is disposed adjacent the force sensor 402 as shown in FIG. 4.

FIGS. 6A-6D are schematic, simplified side view illustrations of a combined force sensor and actuator 600 in accordance with embodiments discussed herein. The combined force sensor and actuator 600 may include an electro-active polymer 604 connected between a first conductive plate 602 and a second conductive plate 603. The combined force sensor and actuator 600 is capable both of producing an electrical response when the electro-active polymer 604 is deformed and of producing an excitation when the polymer is subjected to an electric charge. Thus, combined force sensor and actuator 600 may be used to both measure the force applied to the key and to provide an excitation of the key responsive to the force applied to the key. FIGS. 6A-6D illustrate these aspects of the combined force sensor and actuator 600.

The combined force sensor and actuator 600 may be adapted to fit within the internal area of a key cap 406 such as is shown in FIG. 4. Specifically, the top surface 604 of the first conductive plate 602 is adapted to connect to the internal surface 408 of the key 106. The bottom surface 606 of the second conductive plate 603 may attach to the keyboard 104 or other components of the larger computing system to which the keyboard 104 is attached. For purposes of simplifying the illustration, the key cap 406 is omitted from FIGS. 6A-6D.

When the electro-active polymer 604 receives a force that is applied to the top surface 302 of the key 106, the electro-active polymer 604 produces an electrical response. As shown in FIG. 6B, a force F1 applied to the top surface 302 of the key 106 is transmitted through the key cap 406 to thereby act on the top surface 604 of the conductive plate 602. The force F1 on the top surface of the conductive plate 602 acts to compress the electro-active polymer 604, which, in turn, produces an electrical response. The key 106 may output this electrical response as a signal that indicates the force measured by the electro-active polymer 604 on the output line 310. The signal, which may be a voltage or a current, may be proportional to the force F1, such that the magnitude or amplitude of the signal may be used to estimate the force F1. In some embodiments, the output signal is derived from the electrical response of the polymer 604, rather than being the response itself.

The force signal output by the key 106 is received and processed by the keyboard module 238. In so doing, the keyboard module 238 may analyze the amount of force indicated by the force signal to determine if the key 106 was pressed. Here, the system 200 may define a threshold force amount that corresponds to a certain amount of compression in the electro-active polymer 604. For example, referring to FIG. 6B, the system 200 may define a force threshold that corresponds to the electro-active polymer 604 being compressed from an uncompressed height H1 to decompressed height H2. Once the keyboard module 238 determines that the electro-active polymer has been compressed sufficiently so as to correspond to a key press (e.g., height H2 is achieved), the keyboard module 238 may cause the keyboard controller 232 to output an excitation signal 608 to the key 106. It should be appreciated that the height H2 may vary between embodiments and/or users, and may be dynamically or operationally set. Thus, for example, different users may have different profiles, each of which sets a different height H2 (and thus a different amount of force F1) necessary to register a key press.

When the key 106 receives an excitation signal on the input line, the electro-active polymer 604 responds by physically deforming in at least one direction. This physical deformation causes a tangible or tactile movement in the key. In FIG. 6C, the tangible or tactile movement of the key 106 is represented by the force F2 which acts on the key 106. This movement in the key is felt as feedback such as a "click" or other type of simulated mechanical feedback in response to the key press. In this way, the electro-active polymer may move upward to such that the force of the deformation is opposite to that of the force applied by the user to the key 106. Once the user releases the key 106, the electro-active polymer 604 may return to its uncompressed height H1 under the action of a decompressive force F3 that results from internal pressures or strains present in the compressed polymer 604. as indicated in FIG. 6D.

Figure 7:
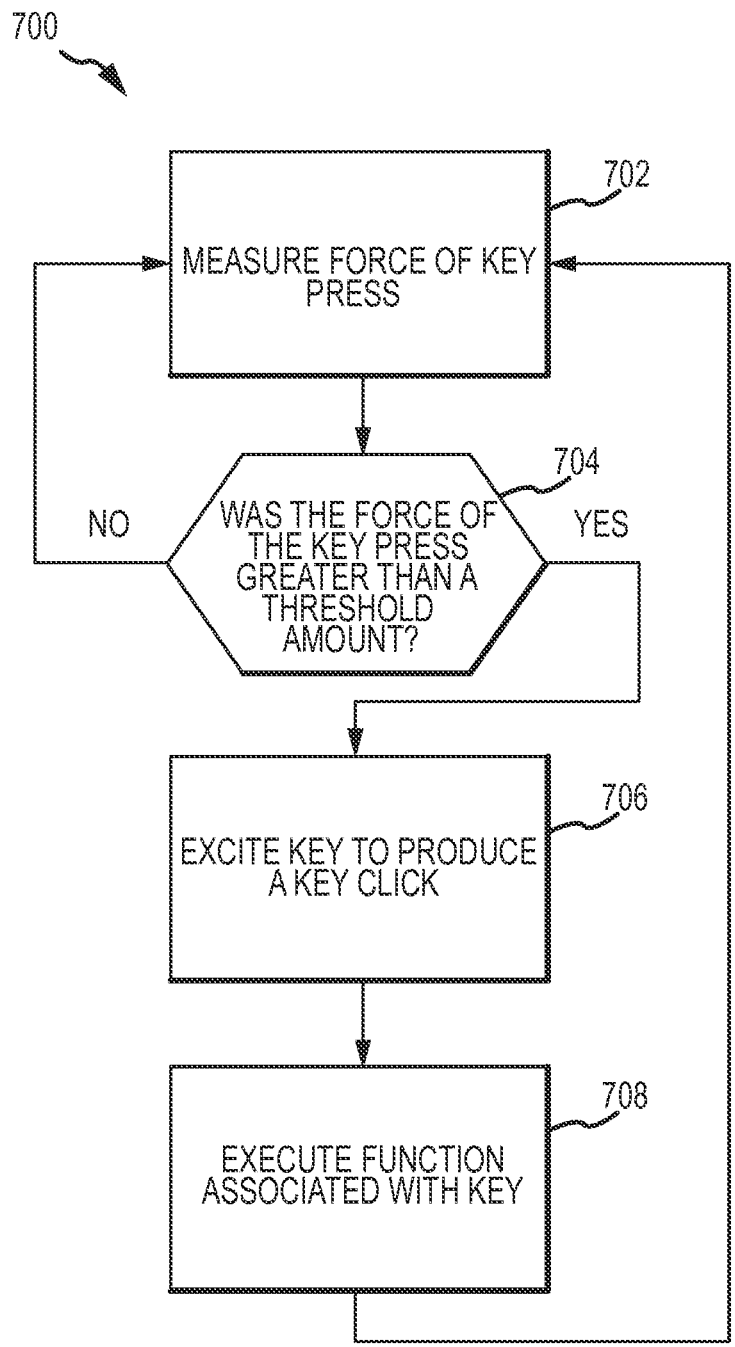
FIG. 7 is a flowchart that illustrates a method in accordance with embodiments discussed herein.

FIG. 7 is a flowchart 700 that illustrates a method in accordance with embodiments discussed herein. As shown in FIG. 7, the keyboard module 238 may provide haptic feedback in response to a key press. In so doing, the keyboard module 238 may provide a tactile response that mimics the "click" associated with a conventional keyboard key.

Initially, in operation 702, the keyboard module 238 determines the force with which a key 106 was pressed. Here, the keyboard module 238 receives a force signal from the keyboard controller 232, which, in turn, received the force signal from the key 106. In some embodiments, such as illustrated in FIGS. 4-5C, the key 106 generates the force signal by the operation of a separate force sensor component, such as a resistive force sensor 502, a strain gauge force sensor 508, or a capacitive force sensor 512. In other embodiments, such as illustrated in FIGS. 5A-5D, the key 106 generates the force signal by the operation of a combined force sensor and actuator 500 component. Following operation 702, operation 704 may be executed.

In operation 704, the keyboard module 238 determines if the keyboard 104 registered a key press. More specifically, the keyboard module 238 compares the force signal received for the key 106 with a threshold amount of force. If the force signal received for the key 106 exceeds the threshold force, the keyboard module 238 determines that a key press occurred for the key 106. In this event, operation 706 may follow operation 704. If the force signal received for the key 106 does not exceed the threshold force, the keyboard module 238 determines that a key press did not occur for the key 106. In this case, operation 702 may again be executed following operation 704. In this way, the force signal is again analyzed until the amount of force measured at the key 106 exceeds the threshold amount.

In operation 706, the keyboard module 238 provides haptic feedback to the user by exciting the key 106. Here, the keyboard module 238 causes the keyboard controller 232 to transmit an excitation signal to the key 106. In some embodiments, such as illustrated in FIGS. 4-5C, the excitation of the key 106 occurs through the operation of a separate actuator component, such as a piezoelectric layer. In other embodiments, such as illustrated in FIGS. 5A-5D, the excitation of the key 106 occurs through the operation of a combined force sensor and actuator 500 component. Following operation 706, operation 708 may be executed.

In operation 708, the keyboard module 238 may execute a command or function that is associated with the key 106 that has been pressed. Here, the keyboard module 238 may register an "A" character if the user pressed the corresponding "A" key. The effect of pressing the "A" key 106 may depend on which of a number of applications 230 is running and is active. For example, if a word-processing application 230 is running and active, the keyboard module 238 may receive the "A" key press and display an "A" character at the cursor. Additionally, the keyboard module 238 may insert the "A" character at the appropriate place in the word-processing document. Following operation 708, operation 702 may again be executed such that additional force inputs are analyzed and processed.

It should be appreciated that FIG. 7 illustrates the operation of exciting the key 106 as occurring before the operation of executing the function associated with the key by way of example and not limitation. Accordingly, in some embodiments the order of these operations may be reversed or these operations may occur substantially simultaneously.

Figure 8:
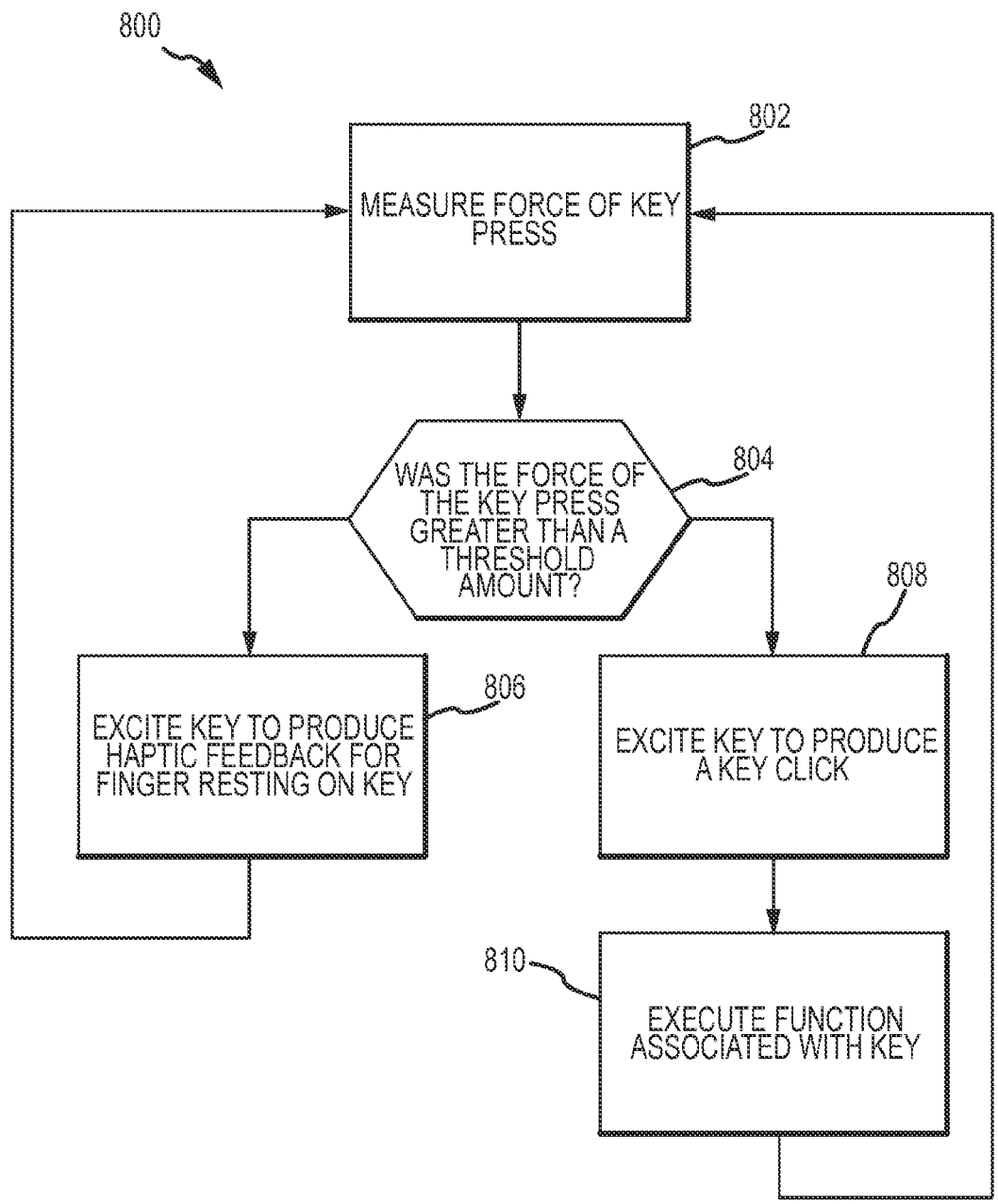
FIG. 8 is a flowchart that illustrates another method in accordance with embodiments discussed herein.

FIG. 8 is a flowchart 800 that illustrates another method in accordance with embodiments discussed herein. As shown in FIG. 8, the keyboard module 238 may provide a haptic feedback in response to a finger that rests on a key 106. In so doing, the keyboard module 238 may provide a warning type of feedback that indicates to a user that his finger is resting on a key, which if pressed, will take an action that could be considered undesirable. For example the keyboard module 238 may provide the warning type of feedback if the user's finger is resting on the delete key.

Initially, in operation 802, the keyboard module 238 determines the force with which a key 106 was pressed. As described above in connection with operation 702, the keyboard module 238 receives a force signal from the keyboard controller 232, which, in turn, received the force signal from the key 106. In operation 804, the keyboard module 238 compares the force signal received for the key 106 with a threshold amount of force. As described above in connection with operation 704, if the force signal received for the key 106 exceeds the threshold force, the keyboard module 238 determines that a key press occurred for the key 106. Similarly, if the force signal received for the key 106 does not exceed the threshold force, the keyboard module 238 determines that a key press did not occur for the key 106.

In the event that a key press did not occur, operation 806 may follow operation 804. In operation 806, the keyboard module 238 determines that a finger or other object is resting on the key because the key 106 was not pressed yet a force was applied to the key 106. In this event, the keyboard module 238 excites the key 106 in a manner that differs from the "click" type feedback of operation 706, but yet still delivers a tangible or tactile response that can be felt by the user. In one embodiment, the keyboard module 238 causes the keyboard controller 232 to transmit an excitation signal to the key 106 that gently vibrates the key 106. Here, the user is provided with a haptic feedback that alerts him to the fact that his finger rests on a particular key that if pressed may cause an undesirable action to occur. Following operation 806, operation 802 may again be executed such that additional force inputs are analyzed and processed.

Referring again to operation 804, if in the event that a key press did not occur operation 808 may be executed following operation 804. Here, as described above in connection with operation 706, yboard module 238 provides haptic feedback to the user by exciting the key 106. Following operation 808, operation 810 may be executed. Here, as described above in connection with operation 708, the keyboard module 238 may execute a command or function that is associated with the key 106 that has been pressed. Following operation 810, operation 802 may again be executed such that additional force inputs are analyzed and processed.

Figure 9:
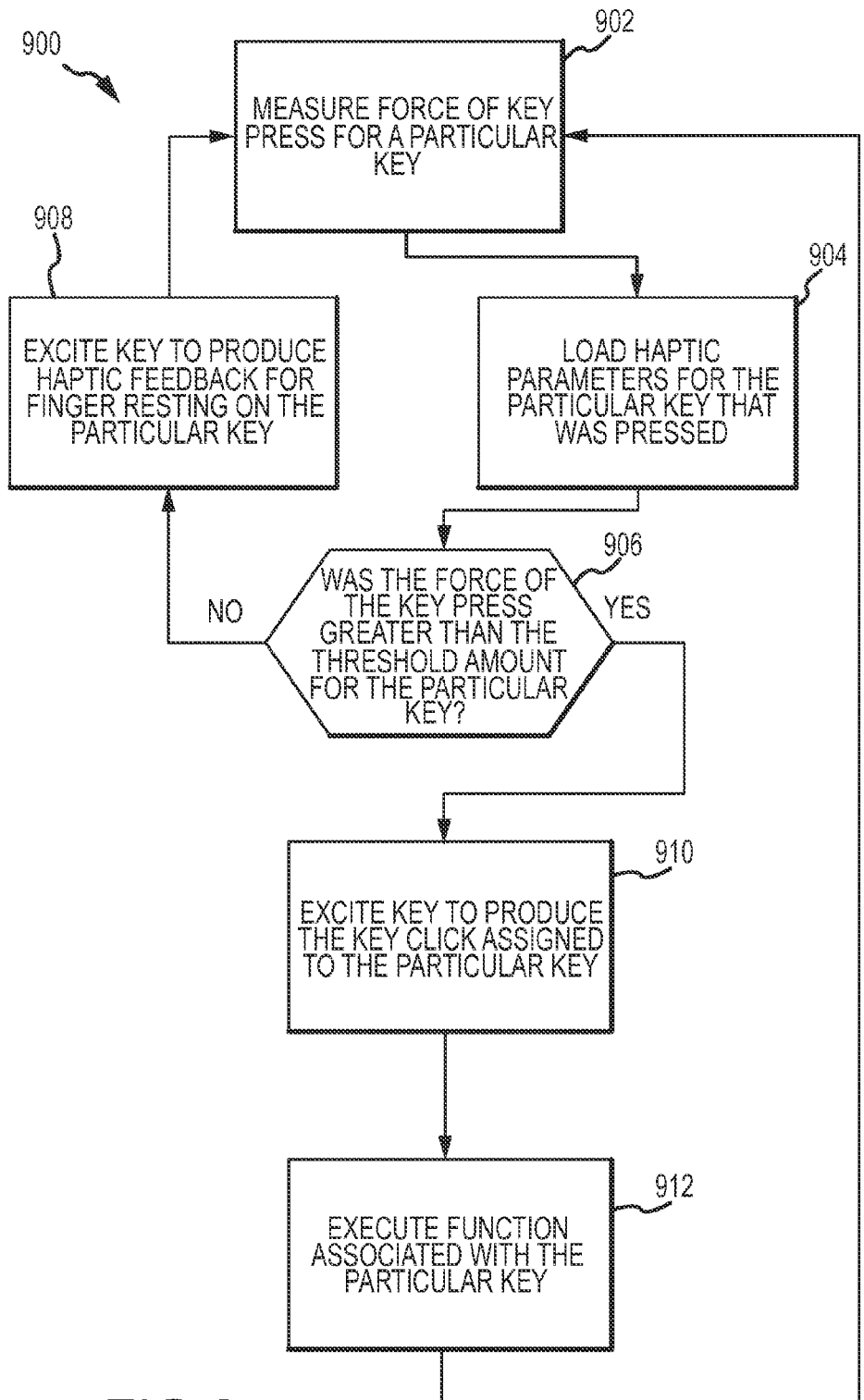
FIG. 9 is a flowchart that illustrates another method in accordance with embodiments discussed herein.

FIG. 9 is a flowchart 900 that illustrates another method in accordance with embodiments discussed herein. As shown in FIG. 9, the keyboard module 238 may provide different types of haptic feedback depending on which key was pressed by a user. In so doing, the keyboard module 238 may provide haptic feedback that enables a user to distinguish between keys based on the tactile feel of each key. For example, the keyboard module 238 may provide a stronger feedback for the command keys when compared to the feedback provided for the character keys.

Initially, in operation 902, the keyboard module 238 determines the force with which a key 106 was pressed. As described above in connection with operation 702, the keyboard module 238 receives a force signal from the keyboard controller 232, which, in turn, received the force signal from the key 106. Following operation 902, operation 904 may be executed.

In operation 904, the keyboard module 238 may load or otherwise reference one or more haptic parameters that are specific to the particular key 106 that was pressed. Here, the keyboard module 238 made reference a keyboard haptic parameter table 239 or other data structure that is stored in the computer readable medium 201. The keyboard haptic parameter table 239 may contain a plurality of threshold force values that are specific to particular keys or types of keys. For example, the keyboard haptic parameter table 239 may specify a relatively light force threshold for the character keys, and a relatively heavier force threshold for the command keys. In this way, the keyboard 104 may be programmed such that the character keys are easier to press them the command keys.

In addition to differing amounts of force threshold, the haptic parameter table 239 may also include different levels of excitation that are to be applied to different keys. Continuing with the above example, the keyboard haptic parameter table 239 may specify a relatively lighter excitation for the character keys and a relatively heavier excitation for the command keys. In this way, the keyboard 104 may be programmed to produce a haptic feedback of a lesser magnitude for the character keys that corresponds to the lesser amount of force that is required to press these keys. Similarly the keyboard 104 may be programmed to produce a haptic feedback of greater magnitude for the command keys that corresponds to the greater amount of force that is required to press these keys.

Following operation 904, operation 906 may be executed. In operation 906, the keyboard module 238 compares the force signal received for the key 106 with a threshold amount of force. As described above in connection with operation 704, if the force signal received for the key 106 exceeds the threshold force, the keyboard module 238 determines that a key press occurred for the key 106. Similarly, if the force signal received for the key 106 does not exceed the threshold force, the keyboard module 238 determines that a key press did not occur for the key 106. In operation 906, the keyboard module 238 uses a value for the threshold force that was received from the haptic parameter table 239 in operation 904. Accordingly, the keyboard module 238 compares the force signal with a threshold force amount that is specific to the particular key or type of key that was pressed.

If, in operation 906, the keyboard module 238 determines that the amount of force applied to a particular key exceeds the threshold amount specified for that particular key, operation 910 may be executed following operation 906. Here, as described above in connection with operation 706, the keyboard module 238 provides haptic feedback to the user by exciting the key 106. In operation 910, the keyboard module 238 uses a value received from the haptic parameter table 239 that specifies the magnitude of the excitation. Accordingly, the keyboard module 238 applies an excitation to the particular key that is specific to the particular key or type of key that was pressed.

Following operation 910, operation 912 may be executed. Here, as described above in connection with operation 708, the keyboard module 238 may execute a command or function that is associated with the key 106 that has been pressed. Following operation 912, operation 902 may again be executed such that additional force inputs are analyzed and processed.

Referring again to operation 906, if the keyboard module 238 determines that the amount of force applied to a particular key does not exceed the threshold amount specified for that particular key, operation 908 may be executed following operation 906. Here, as described above in connection with operation 806, the keyboard module 238 may gently vibrate the key 106 after determining that a finger or other object is resting on the key because the key 106 was not pressed yet a force was applied to the key 106. Following operation 908, operation 902 may again be executed such that additional force inputs are analyzed and processed. In alternative embodiments, operation 902 may the executed directly following operation 908. In this way, the keyboard module 238 provides no haptic feedback in the event that the key was not pressed.

Figure 10:
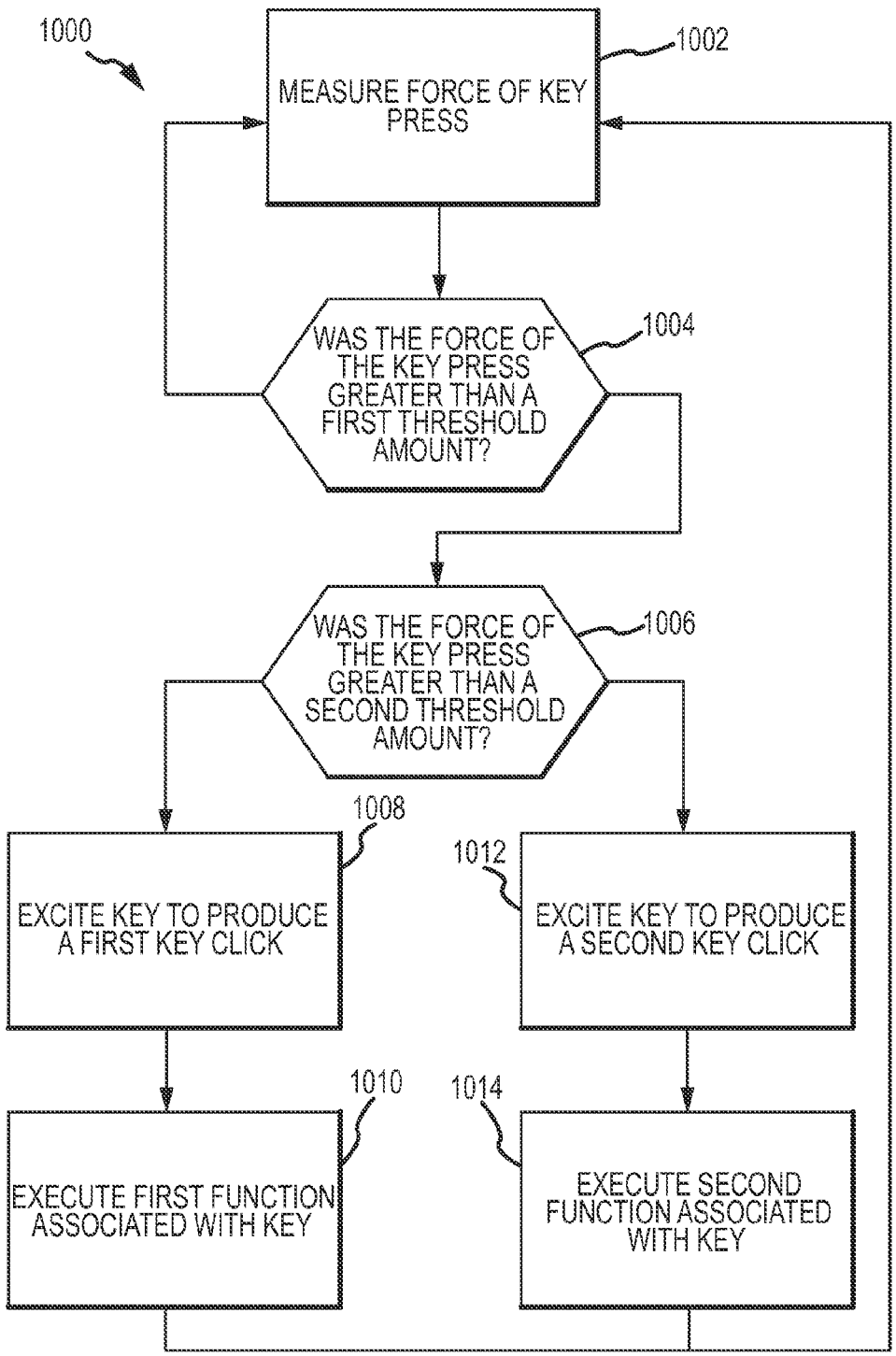
FIG. 10 is a flowchart that illustrates another method in accordance with embodiments discussed herein.

FIG. 10 is a flowchart 1000 that illustrates another method in accordance with embodiments discussed herein. As shown in FIG. 10, the keyboard module 238 may provide two levels of haptic feedback for an individual key. In so doing, the keyboard module 238 may provide different haptic feedback for different functions that may be assigned to an individual key. For example, the keyboard module 238 may interpret a light press of the letter key "A" as indicating a lower case "a," and a heavier press of the letter key "A" as indicating a upper case "A."

Initially, in operation 1002, the keyboard module 238 determines the force with which a key 106 was pressed. As described above in connection with operation 702, the keyboard module 238 receives a force signal from the keyboard controller 232, which, in turn, received the force signal from the key 106. In operation 1004, the keyboard module 238 compares the force signal received for the key 106 with a threshold amount of force. As described above in connection with operation 704, if the force signal received for the key 106 exceeds the threshold force, the keyboard module 238 determines that a key press occurred for the key 106. Similarly, if the force signal received for the key 106 does not exceed the threshold force, the keyboard module 238 determines that a key press did not occur for the key 106. In the event that a key press did not occur, operation 1002 may again be executed following operation 1004 such that additional force inputs are analyzed and processed.

In the event that the keyboard module 238 determines, in operation 1004, that a key press did occur, operation 1006 may be executed following operation 1004. In operation 1006, the keyboard module 238 further analyzes the force signal from the key 106 to determine if the key was deeply pressed. More specifically, the keyboard module 238 compares the force signal to a second force threshold amount that is greater than the first threshold amount. If the keyboard module 238 finds that the force with which the key was pressed exceeds the second threshold amount, the keyboard module 238 determines that the key 106 was deeply pressed. In this event, operation 1012 may be executed following operation 1006. If the key 106 was not deeply pressed, operation 1008 may be executed following operation 1006.

Turning first to operation 1008, it is noted that here the key 106 was pressed, but not deeply pressed. In this case, the keyboard module 238 may proceed substantially as described above in connection with operation 706. Specifically, the keyboard module 238 may provide haptic feedback to the user by exciting the key 106. In so doing, the keyboard module 238 may provide the key 106 with an excitation whose magnitude corresponds to or is otherwise commensurate with the key press that was received. More particularly, because the keyboard module 238 received a key press, but not a deep press, the keyboard module 238 may provide the key 106 with an excitation whose magnitude is less than that of a deep key press.

Following operation 1008, the keyboard module 238 may, in operation 1010, execute a command or function that is associated with the key 106 that has been pressed but not deeply pressed. In so doing, the keyboard module 238 may execute one of at least two functions or commands that are associated with the key 106. For example, the key 106 may be an "A" key that is associated with both a lowercase "a" and an upper case "A." In one embodiment, pressing a key but not deeply pressing the key may be associated with the lowercase "a" key function. Accordingly, in operation 1010, the key module 238 may execute a lowercase "a," as appropriate. Following operation 1010, operation 1002 may again be executed such that additional force inputs are analyzed and processed.

Turning now to operation 1012, it is noted that here the key 106 was deeply pressed. In operation 1012, the keyboard module 238 may provide haptic feedback to the user by exciting the key 106. In so doing, the keyboard module 238 may provide the key 106 with excitation whose magnitude corresponds to or is otherwise commensurate with a deep key press. More particularly, the keyboard module 238 may provide the key 106 with an excitation whose magnitude is greater than the magnitude of the excitation provided to the key 106 when the key 106 was pressed but not deeply pressed.

Following operation 1012, the keyboard module 238 may, in operation 1014, execute a command or function that is associated with the key 106 that has been deeply pressed. In so doing, the keyboard module 238 may execute a second of at least two functions or commands that are associated with the key 106. Continuing with the above example, deeply pressing the key 106 may be associated with the uppercase "A" key function. Accordingly, in operation 1010, the key module 238 may execute an uppercase "A," as appropriate. Following operation 1014, operation 1002 may again be executed such that additional force inputs are analyzed and processed.

Figure 11:
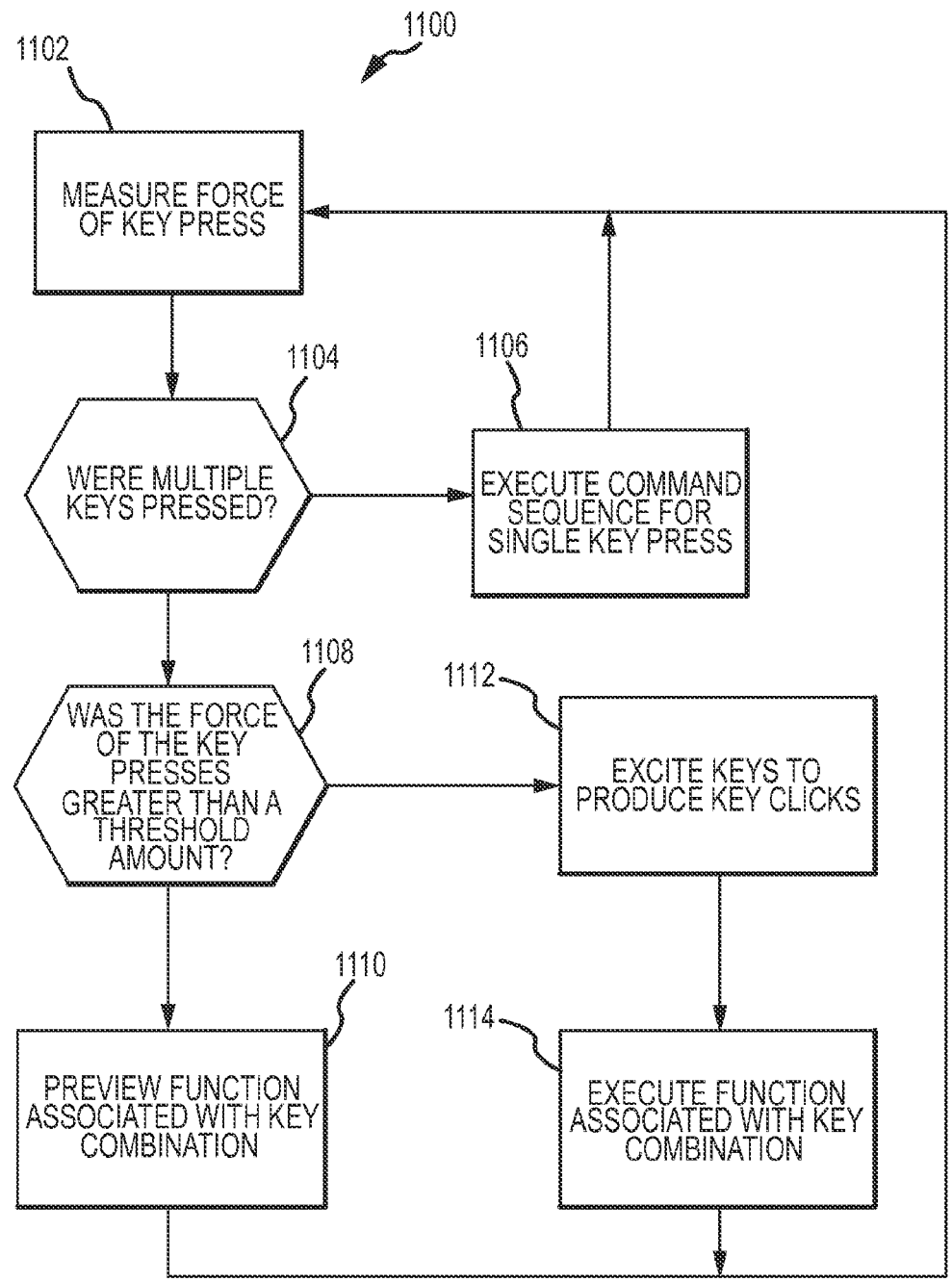
FIG. 11 is a flowchart that illustrates another method in accordance with embodiments discussed herein.

FIG. 11 is a flow chart 1100 that illustrates another method in accordance with embodiments discussed herein. As shown in FIG. 11, the keyboard module 238 may provide a preview of a command that corresponds to a combination of keys on which the user rests his fingers. In so doing, the keyboard module 238 may allow the user to view the effects of executing a keyboard command prior to actually executing the command. For example, the keyboard module 238 may temporarily italicize a highlighted portion of text while a user rests his fingers on the "control" key and the "I" key.

Initially, in operation 1102, the keyboard module 238 determines the force with which a key 106 or multiple key were pressed. As described above in connection with operation 702, the keyboard module 238 receives a force signal from the keyboard controller 232, which, in turn, received the force signal from the key 106. Following this, the keyboard module 238 may, in operation 1104, analyze the received force signal to determine if multiple keys were pressed. If multiple keys were not pressed, the keyboard module 238 may proceed to operation 1106 where a command sequence for a single key press may be executed. If multiple keys were pressed, the keyboard module 238 may proceed to operation 1108.

In operation 1108, the keyboard module 238 compares the force signals received for the keys 106 with a threshold amount of force. If the force signals received for the keys 106 exceed the threshold force, the keyboard module 238 determines that a key press combination has occurred for the keys 106. Similarly, if the force signals received for the keys 106 do not exceed the threshold force, the keyboard module 238 determines that a key press combination did not occur for the key 106.

In the event that a key press combination did not occur, operation 1110 may follow operation 1108. In operation 1108, the keyboard module 238 determines that fingers or other objects are resting on the keys because the keys 106 were not pressed, but a force was applied to the keys 106. In this event, the keyboard module 238 previews a function associated with the combination of keys 106 on which the fingers or other objects are resting. In so doing, the keyboard module 238 may allow the user to view the effects of executing a keyboard command prior to actually executing the command. If the fingers or objects are removed from the keys 106 without further pressing the keys 106, the keyboard module 238 may undo the displayed effects of the keyboard command. For example, while the fingers or other objects rest on the key combination, the keyboard module 238 may temporarily italicize a highlighted portion of text while a user rests his fingers on the "control" key and the "I" key. Once the fingers or other objects are removed from the key combination, the effects of the italicize command are no longer displayed. In accordance with other embodiments different commands such as underline, capitalize, bold, and so on may be previewed as described above. Following operation 806, operation 802 may again be executed such that additional force inputs are analyzed and processed.

Referring again to operation 1108, if in the event that a key press combination did not occur, operation 808 may be executed following operation 804. Here, the keyboard module 238 provides haptic feedback to the user by exciting the keys 106 that were pressed to make the key combination. Following operation 1112, operation 1114 may be executed. Here, the keyboard module 238 may execute a command or function that is associated with the combination of key 106 that were been pressed. Continuing with the above example, the keyboard module 238 may italicize a highlighted portion of text if the user presses the "control" key and the "I" key. Following operation 1114, operation 1102 may again be executed such that additional force inputs are analyzed and processed.

Figure 12:
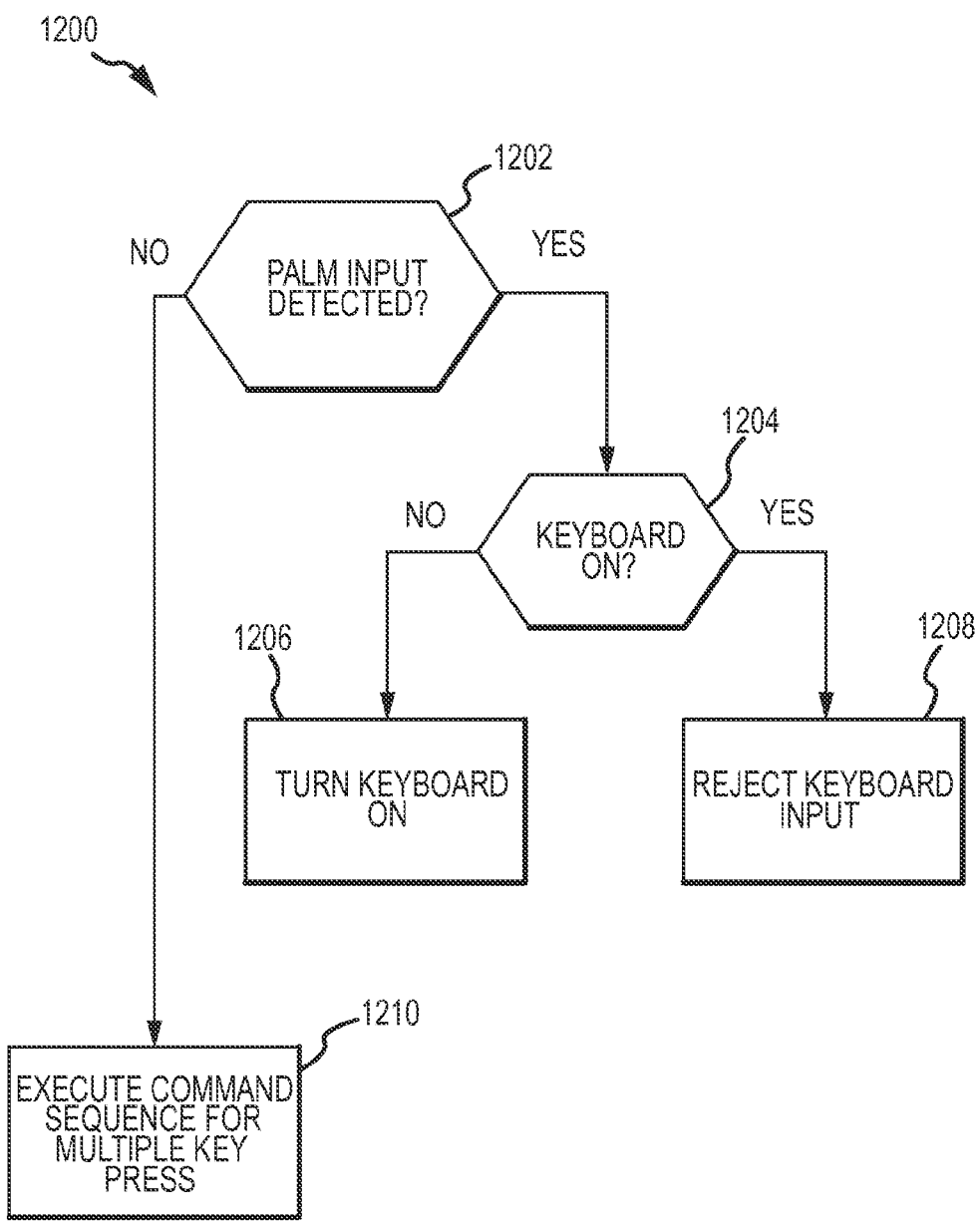
FIG. 12 is a flowchart that illustrates another method in accordance with embodiments discussed herein.

FIG. 12 is a flowchart 1200 that illustrates another method in accordance with embodiments discussed herein. As shown in FIG. 12, the keyboard module 238 may be configured to reject keyboard input or to take other actions if the keyboard module 238 senses that a palm or other object is mashing the keyboard. Here, the keyboard module 238 may avoid unnecessarily executing commands or functions that do not correspond to intended keyboard input.

Initially, in operation 1202, the keyboard module 238 determines if a palm input was received. Here, the keyboard module 238 receives a force signal that indicates a force being applied to a plurality of keys 106. In operation 1202, the keyboard module 238 analyzes the force signal to determine if the keyboard is being mashed such as by determining if a high number of keys that are in close proximity to each other on the keyboard are being pressed simultaneously. For example, a cluster of keys such as "tab," "1," "a," and "caps lock" that are all pressed simultaneously may not indicate a meaningful input, but rather may be the result of a palm or other larger object pressing, resting or otherwise contacting the keyboard 104. If, in operation 1202, the keyboard module 238 determines that a palm input did not occur, the keyboard module 238 may proceed to operation 1210 where a command sequence for multiple key presses is executed. If, in operation 1202, the keyboard module 238 determines that a palm input did occur, the keyboard module 238 may proceed to operation 1204.

In operation 1204, the keyboard module 238 determines if the keyboard 104 was on or otherwise awake prior to receiving the palm input detected in operation 1202. If the keyboard 104 was not awake, the palm input could represent an attempt by the user to wake the keyboard 104. Accordingly, if the keyboard 104 was not awake, then the keyboard module 238 may proceed to wake the keyboard in operation 1206. If, however, the keyboard was awake when the p loopalm input was received, the keyboard module 238 may proceed to reject the palm input in operation 1208.

Figure 13:
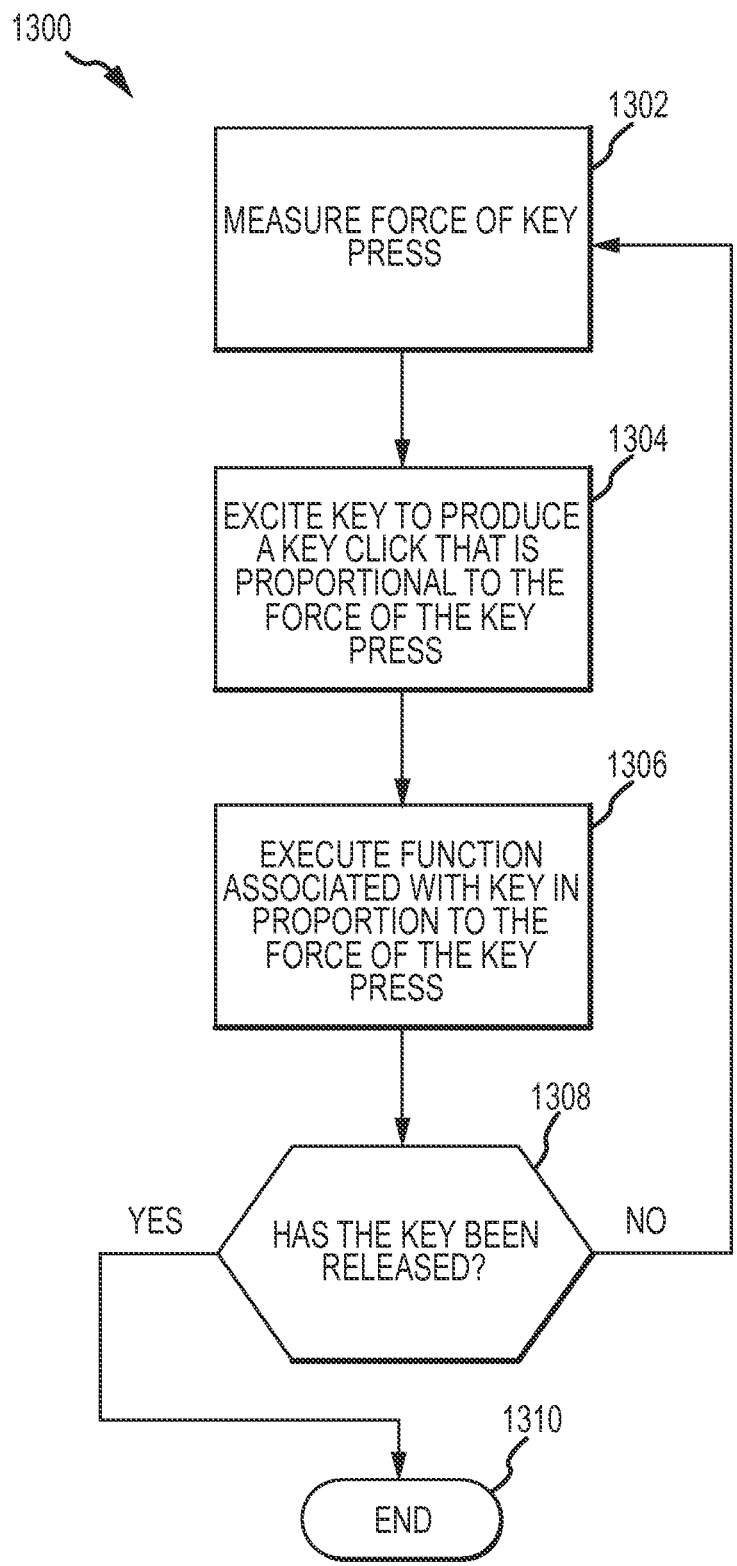
FIG. 13 is a flowchart that illustrates another method in accordance with embodiments discussed herein.

FIG. 13 is a flowchart 1300 that illustrates another method in accordance with embodiments discussed herein. As shown in FIG. 13, the keyboard module 238 may receive a continuous key press and, in response, provide a continuous haptic feedback and continuously execute a keyboard function or command. In so doing, the keyboard module 238 may provide the feedback and execute the keyboard function in amounts that are proportionate to the force applied to the key. For example, if the user presses and holds a fast-forward key, the keyboard module 238 may fast-forward content, such as a music track, at a rate that is proportional to the amount of force applied to the key. Additionally, as the speed of the fast forward increases, the magnitude of the feedback provided to the user may also increase.

Initially, in operation 1302, the keyboard module 238 determines the force with which a key 106 was pressed. Here, the keyboard module 238 receives a force signal from the keyboard controller 232, which, in turn, received the force signal from the key 106. The force signal received by the keyboard module 238 may be a continuously varying signal such that the instantaneous value of the force signal represents an amount of force that is substantially currently being applied to the 106. Following operation 1302, operation 1304 may be executed.

In operation 1304, the keyboard module 238 provides a haptic feedback to the user by exciting the key 106. Here, the keyboard module 238 causes the keyboard controller 232 to transmit an excitation signal to the key 106 that is proportionate to the amount of force applied to the key 106. Continuing with the above example, if a user presses and holds a fast-forward key, the keyboard module 238 may provide larger magnitude excitations with greater amounts of force applied to the key 106. Following operation 1304, operation 1306 may be executed. Following operation 1304 operation 1306 may be executed.

In operation 1306, the keyboard module 238 may execute a command or function that is associated with the key 106 that has been pressed. Continuing with the above example, if a user presses and holds a fast-forward key, the keyboard module 238 may fast-forward a music track with greater speed as greater amounts of force are applied to the key 104. Following operation 1306, operation 1308 may be executed.

In operation 1308, the keyboard module 238 may determine if the key 106 has been released. Here, the keyboard module 238 may determine if the force applied to the key 106 is reduced to be substantially zero or to be an otherwise negligible amount indicating that the user no longer applies of force to key 106. If, in operation 1308, the keyboard module 238 determines that the key 104 has not been released, the keyboard module 238 may loop back to perform the operations 1302, 1304, and 1306 again. In this way, the keyboard module 238 provides continuous feedback and command execution in response to a continuous key press. If, in operation 1308, the keyboard module 238 determines that the key 104 has been released, the process may end in operation and 1310.

Figure 14:
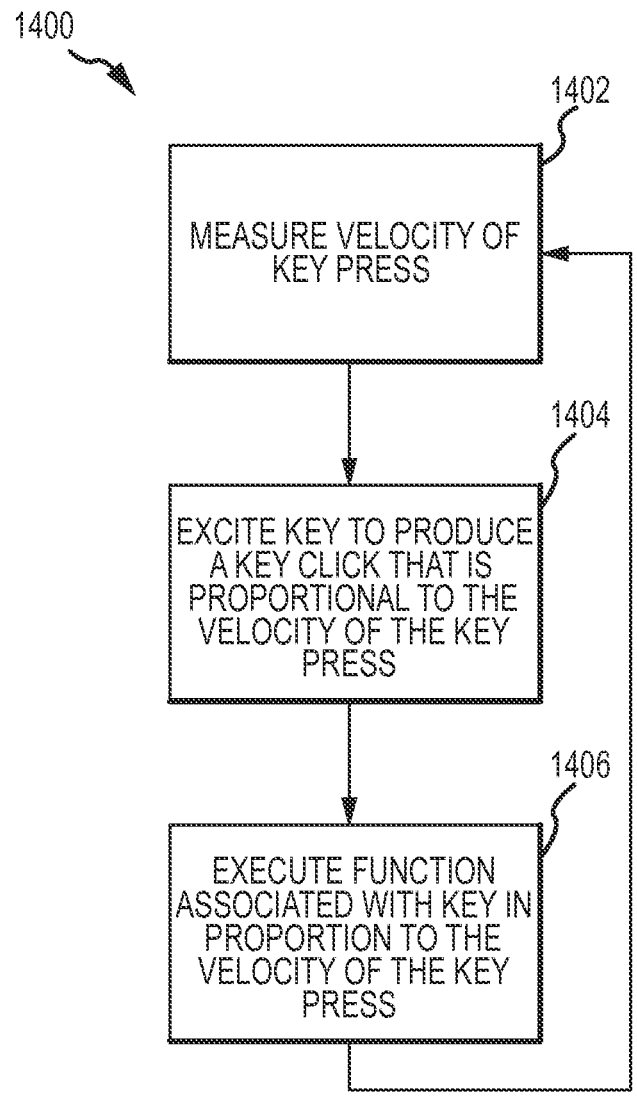
FIG. 14 is a flowchart that illustrates another method in accordance with embodiments discussed herein.

FIG. 14 is a flow chart 1400 that illustrates another method in accordance with embodiments discussed herein. As shown in FIG. 14, the keyboard module 238 may receive a discrete key press and provide a variable response. In so doing, the keyboard module 238 may execute a keyboard function in proportion to a velocity with which a key was pressed. For example, in the context of a musical instrument application, the response of a musical instrument may be varied depending on how rapidly the user strikes a key that corresponds to a button key or string on the musical instrument.

Initially, in operation 1402, the keyboard module 238 determines the velocity with which a key 106 was pressed. Here, the keyboard module 238 receives a force signal from the keyboard controller 232, which, in turn, received the force signal from the key 106. The force signal received by the keyboard module 238 may be a continuously varying signal such that the instantaneous value of the force signal represents an amount of force that is substantially currently being applied to the 106. In operation 1402, the keyboard module 238 analyzes the force signal to determine a velocity with which the key was pressed. In one embodiment, the keyboard module 238 determines the velocity with which the key was pressed by computing the force applied over time. In another embodiment, the keyboard module 238 determines the velocity with which the key was pressed by analyzing the peak force received. Following operation 1402, operation 1404 may be executed.

In operation 1404, the keyboard module 238 provides a haptic feedback to the user by exciting the key 106. Here, the keyboard module 238 causes the keyboard controller 232 to transmit an excitation signal to the key 106 that is proportionate to the amount of force applied to the key 106. Continuing with the above example, if a user strikes the key 106, the keyboard module 238 may provide larger magnitude excitations with greater amounts of velocity applied to the key 106. Following operation 1404, operation 1406 may be executed.

In operation 1306, the keyboard module 238 may execute a command or function that is associated with the key 106 that has been pressed. Continuing with the above example, if a user strikes a key while using a musical instrument application, the keyboard module 238 may trigger a greater response from the musical instrument as the key 104 if struck with greater velocity. Following operation 1406, operation 1402 may again be executed such that additional force inputs are analyzed and processed.

A keyboard or keyboard key that has a force sensor that measures the force imparted to the key when a user presses the key or rests a finger on a key. Key embodiments may also include an actuator that excites the in order to provide feedback to the user in accordance with various feedback methods disclosed herein.

Conclusion

The foregoing description has broad application. Accordingly, the discussion of any embodiment is meant only to be an example and is not intended to suggest that the scope of the disclosure, including the claims, is limited to these examples.

What is claimed is:

1. A key for a computing device keyboard, comprising:
   a key cap;
   a force sensor at least partially contained within the key cap and coupled to an internal top surface of the key cap, the force sensor configured to measure an amount of force imparted to a surface of the key cap; and
   an output line configured to carry a signal that indicates an amount of force imparted to the key cap through a force signal that varies based on the force measured by the force sensor;
   wherein the force sensor is a strain gauge that changes a resistance by deforming in response to the force imparted to the surface of the key cap, the change in resistance being used to modulate the force signal, further comprising an input line configured to receive an excitation signal responsive to the force signal, and an actuator contained within the key cap, the actuator configured to excite the key cap in response to the excitation signal such that an opposing force is imparted to the key cap responsive to the force that is imparted to the surface of the key cap, wherein the actuator is a piezoelectric material that excites the key cap by deforming under a mechanical strain that is induced in the piezoelectric material in response to the excitation signal, and wherein the opposing force imparted to the key cap causes movement of the keycap.

2. The key of claim 1, wherein the force sensor is a resistive force sensor that responds to the force imparted to the surface of the key cap with a change in conductivity that is used to modulate the force signal.

3. The key of claim 1, wherein the force sensor is a capacitive force sensor that includes a compressible dielectric that changes the capacitance of the capacitive force sensor by deforming in response to the force imparted to the surface of the key cap, the change in capacitance being used to modulate the force signal.

4. A method of controlling a keyboard, comprising
   receiving an input signal at a computing device from a keyboard, the input signal indicating an amount of force imparted to a key on the keyboard detected by a force sensor at least partially contained within a key cap of the key and coupled to an internal top surface of the key cap;
   determining, by the computing device, if the key was pressed by determining if the amount of force imparted to the key exceeds a threshold amount; and
   executing, by the computing device, a function that is associated with the key if the amount of force imparted to the key exceeds the threshold amount;
   wherein the force sensor is a strain gauge that changes a resistance by deforming in response to the force imparted to the surface of the key cap, the change in resistance being used to modulate the force signal, further comprising an input line configured to receive an excitation signal responsive to the force signal, and an actuator contained within the key cap, the actuator configured to excite the key cap in response to the excitation signal such that an opposing force is imparted to the key cap responsive to the force that is imparted to the surface of the key cap, wherein the actuator is a piezoelectric material that excites the key cap by deforming under a mechanical strain that is induced in the piezoelectric material in response to the excitation signal, and wherein the opposing force imparted to the key cap causes movement of the keycap.

5. The method of claim 4, further comprising
   providing feedback to the key press by transmitting an excitation signal from the computing device to the keyboard that causes a tangible excitation in the key.

6. A method of controlling a keyboard, comprising
   receiving an input signal at a computing device from a keyboard, the input signal indicating an amount of force imparted to a key on the keyboard detected by a force sensor at least partially contained within a key cap of the key and coupled to an internal top surface of the key cap;
   determining, by the computing device, if the key was pressed by determining if the amount of force imparted to the key exceeds a threshold amount;
   executing, by the computing device, a function that is associated with the key if the amount of force imparted to the key exceeds the threshold amount; and
   providing feedback to the key press by transmitting an excitation signal from the computing device to the keyboard that causes a tangible excitation in the key, wherein the tangible excitation is of a first type that includes an initial excitation of a first magnitude that occurs for a predetermined duration after the key press occurs, and after the predetermined duration elapses no further excitations of the first magnitude occur while the force imparted to the key remains greater than the threshold amount, the method further comprising
   determining, by the computing device, that a finger is resting on the key if the amount of force imparted to the key is not greater than the threshold amount;
   providing feedback to the finger resting on the key by transmitting an excitation signal from the computing device to the keyboard that causes a tangible excitation of a second type in the key, the tangible excitation of the second type including a vibration that occurs so long as the force is imparted to the key and so long as the force imparted to the key does not exceed the threshold amount.

7. The method of claim 4, further comprising
   determining a key type for the key; and
   fetching a data value for the threshold amount used to determine if the key was pressed from a data structure that defines a plurality threshold amounts for various key types.

8. The method of claim 4, wherein the threshold amount is a first threshold amount, and the function associated with the key is a first function, the method further comprising
  determining, by the computing device, if the key was deeply pressed by determining if the amount of force imparted to the key is greater than a second threshold amount that is greater than the first threshold amount; and
  executing, by the computing device, a second function associated with the key that is different from the first function if the amount of force imparted to the key was greater than the second threshold amount.

9. The method of claim 8, further comprising:
  if the key was pressed, providing feedback to the key press by transmitting an excitation signal from the computing device to the keyboard that causes a tangible excitation of a first magnitude in the key; and
  if the key was deeply pressed, providing feedback to the deep key press by transmitting an excitation signal from the computing device to the keyboard that causes a tangible excitation of a second magnitude in the key, wherein the first magnitude is greater than the second magnitude.

10. The method of claim 4, wherein the input signal is a first input signal and the key is a first key, the method comprising
  receiving a second input signal at the computing device from the keyboard, the second input signal indicating an amount of force imparted to a second key on the keyboard;
  determining, by the computing device, if both the first key and the second key were pressed by determining if the amount of force imparted to both the first key and the second key is greater than a threshold amount; and
  executing, by the computing device, a command that is associated with the combination of the first key and the second key if the amount of force imparted to both the first key and the second key is greater than a threshold amount.

11. The method of claim 10, further comprising:
  providing feedback to both the first key press and the second key press by transmitting an excitation signal from the computing device to the keyboard that causes a tangible excitation in both the first key and the second key.

12. The method of claim 4, wherein the input signal is a first input signal and the key is a first key, the method comprising
  receiving a second input signal at the computing device from the keyboard, the second input signal indicating an amount of force imparted to a second key on the keyboard;
  determining, by the computing device, that a finger is resting on the first key if the amount of force imparted to the first key is not greater than the threshold amount;
  determining, by the computing device, that a finger is resting on the second key if the amount of force imparted to the second key is not greater than the threshold amount;
  displaying a result of the command but not executing the command while a finger is resting on both the first key and the second key.

13. A method of controlling a keyboard, comprising
  receiving an input signal at a computing device from a keyboard, the input signal indicating an amount of force imparted to a key on the keyboard detected by a force sensor at least partially contained within a key cap of the key and coupled to an internal top surface of the key cap;
  in response to the receiving the input signal, executing, by the computing device, a function proportionally based on the amount of force that is imparted to the key, wherein the function is associated with the key;
  wherein the force sensor is a strain gauge that changes a resistance by deforming in response to the force imparted to the surface of the keycap, the change in resistance being used to modulate the force signal, further comprising an input line configured to receive an excitation signal responsive to the force signal, and an actuator contained within the key cap, the actuator configured to excite the key cap in response to the excitation signal such that an opposing force is imparted to the key cap responsive to the force that is imparted to the surface of the key cap, wherein the actuator is a piezoelectric material that excites the key cap by deforming under a mechanical strain that is induced in the piezoelectric material in response to the excitation signal, and wherein the opposing force imparted to the key cap causes movement of the keycap.

14. The method of claim 13, further comprising
  providing feedback by transmitting an excitation signal from the computing device to the keyboard that causes a tangible excitation in the key that is proportional to the force that is imparted to the key.

15. The key of claim 1, wherein the actuator is coupled to the key cap by a first adhesive and the force sensor is coupled to the actuator by a second adhesive.

16. The key of claim 1, wherein the opposing force imparted to the key cap provides a tactile feedback responsive to the force that is imparted to the surface of the key cap.

* * * * *